(12) United States Patent
Lesso et al.

(10) Patent No.: US 11,101,778 B2
(45) Date of Patent: Aug. 24, 2021

(54) CLASS D AMPLIFIERS

(71) Applicant: Cirrus Logic International Semiconductor Ltd., Edinburgh (GB)

(72) Inventors: John Paul Lesso, Edinburgh (GB); Toru Ido, Kanagawa (JP)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 16/740,800

(22) Filed: Jan. 13, 2020

(65) Prior Publication Data
US 2020/0153397 A1 May 14, 2020

Related U.S. Application Data

(63) Continuation of application No. 15/982,237, filed on May 17, 2018, now Pat. No. 10,587,232.

(51) Int. Cl.
*H03F 3/21* (2006.01)
*H04R 3/00* (2006.01)
(Continued)

(52) U.S. Cl.
CPC ............ *H03F 3/2173* (2013.01); *H04R 3/00* (2013.01); *H04R 29/001* (2013.01); *H03F 3/185* (2013.01);
(Continued)

(58) Field of Classification Search
CPC .................. H03F 3/2173; H04R 3/00
See application file for complete search history.

(56) References Cited

U.S. PATENT DOCUMENTS 6,097,249 A * 8/2000 Strickland ............. H03F 3/2178
330/10
6,552,607 B1 4/2003 Danielson
(Continued)

FOREIGN PATENT DOCUMENTS

EP 2654205 A1 10/2013
EP 2681930 A1 1/2014

OTHER PUBLICATIONS

International Search Report and Written Opinion of the International Searching Authority, International Application No. PCT/GB2019/051339, dated Jun. 28, 2019.

*Primary Examiner* — Patricia T Nguyen
(74) *Attorney, Agent, or Firm* — Jackson Walker L.L.P.

(57) ABSTRACT

The present disclosure relates to Class D amplifier circuitry comprising: an input for receiving an input signal; first and second output nodes for driving a load connected between the first and second output nodes. A first driver stage is provided for switching the first node between a first supply rail and a second supply rail, and a second driver stage is provided for switching the second node between the first supply rail and the second supply rail. The Class D amplifier circuitry also includes first driver control circuitry configured to receive a first carrier wave and control the switching of the first driver stage based in part on the first carrier wave; second driver control circuitry configured to receive a second carrier wave and control the switching of the second driver stage based in part on the second carrier wave; and a carrier wave generator configured to provide the first carrier wave and the second carrier wave. A phase shift between the first carrier wave and the second carrier wave is adjustable responsive to a mode control signal.

20 Claims, 10 Drawing Sheets

(51) Int. Cl.
*H03F 3/217* (2006.01)
*H04R 29/00* (2006.01)
*H03F 3/185* (2006.01)

(52) U.S. Cl.
CPC .... *H03F 2200/03* (2013.01); *H03F 2200/165* (2013.01); *H03F 2200/168* (2013.01); *H03F 2200/267* (2013.01); *H04R 2499/11* (2013.01)

(56) References Cited

U.S. PATENT DOCUMENTS

| | | |
|---|---|---|
| 2003/0103361 A1 | 6/2003 | Krein |
| 2006/0072657 A1* | 4/2006 | Putzeys ............ H03F 1/32 375/238 |
| 2006/0103458 A1 | 5/2006 | Hansen et al. |
| 2007/0152750 A1 | 7/2007 | Andersen et al. |
| 2007/0229159 A1* | 10/2007 | Krishnan ............ H03F 3/217 330/253 |
| 2008/0315948 A1* | 12/2008 | Pyykonen ............ H03F 3/2173 330/251 |
| 2013/0089161 A1 | 4/2013 | Heineman |
| 2013/0216076 A1* | 8/2013 | Knudsen ............ H04R 25/305 381/312 |
| 2013/0300592 A1* | 11/2013 | Snelgrove ............ H03M 3/30 341/143 |
| 2015/0288335 A1 | 10/2015 | Hoyerby |
| 2016/0218703 A1* | 7/2016 | Nielsen ............ H03F 3/2173 |
| 2018/0076806 A1 | 3/2018 | Yamauchi et al. |
| 2018/0331660 A1 | 11/2018 | Hoyerby |
| 2019/0007010 A1* | 1/2019 | Hoyerby ............ H03F 1/523 |

* cited by examiner

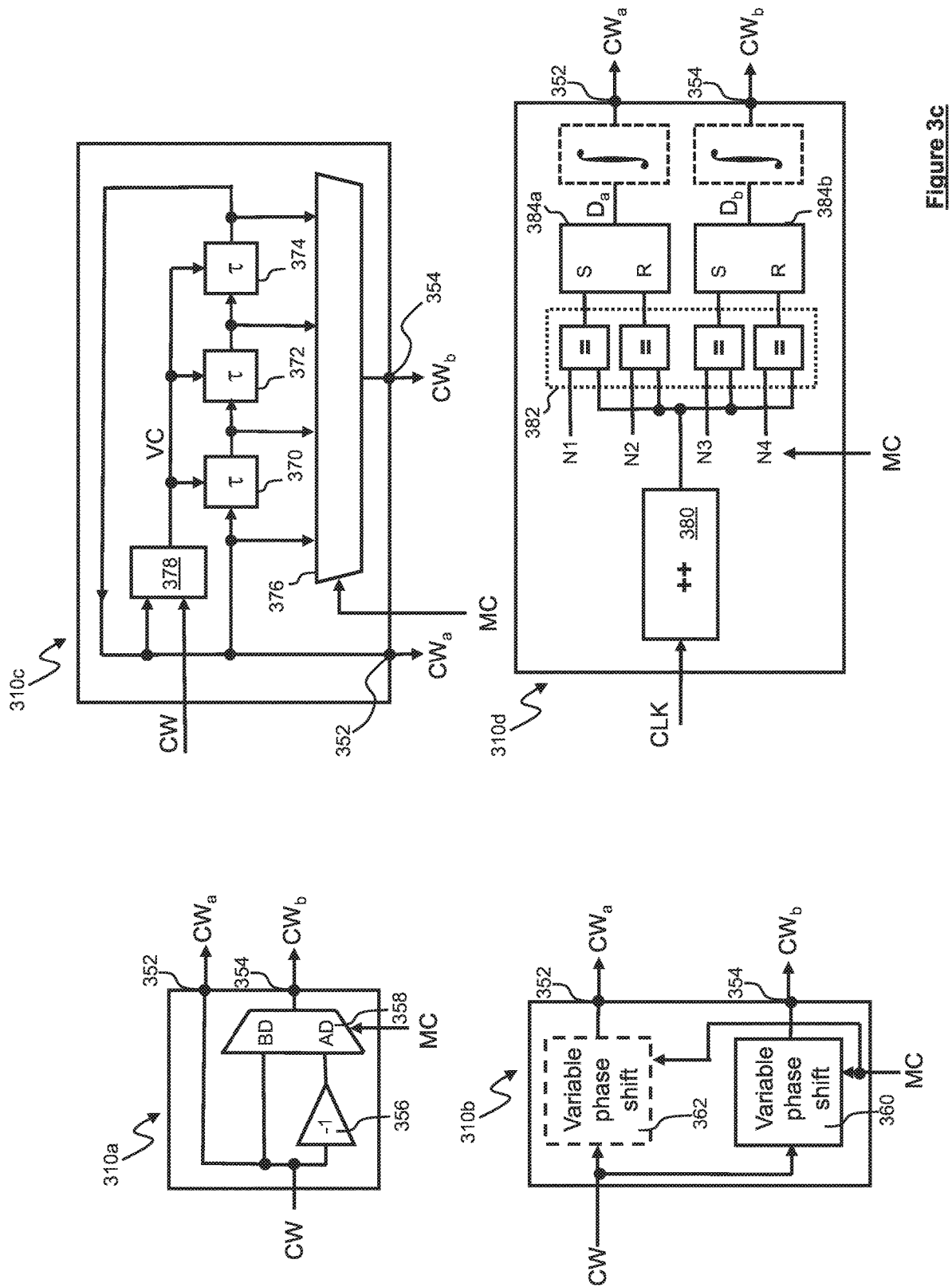

CLASS D AMPLIFIERS

The present disclosure is a continuation of U.S. Non-Provisional patent application Ser. No. 15/982,237, filed May 17, 2018, which is incorporated by reference herein in its entirety.

FIELD OF THE INVENTION

The present disclosure relates to the field of Class D amplifiers. In particular, the present disclosure relates to a system and method for dynamically adjusting an operating mode of a Class D amplifier.

BACKGROUND

Class D amplifiers are increasingly being used in output stages of electronic devices for which power efficiency is important, such as mobile telephones, portable media players, laptop and tablet computers and wireless headphones, earphones and earbuds.

A Class D amplifier receives an analogue input signal and outputs a sequence of pulses, with the width and separation of pulses being representative of the amplitude of the input analogue signal.

Some Class D amplifiers may be designed to operate in Class AD mode, some Class D amplifiers may be designed to operate in Class BD mode.

In Class AD designs, the signal output at a point in time by the Class D amplifier can take one of two amplitude values, a high value and a low value. Thus, in Class AD mode the output signal is bi-level. This is shown schematically in the upper waveform diagram 110 of FIG. 1, which shows (in the lowermost waveform 112) a differential signal applied to a bridge-tied load by the output stage of a full bridge Class D amplifier, and corresponding output signals 114, 116 generated by first and second drivers of the output stage of the amplifier. In this example the output signals 114, 116 generated by the first and second drivers swing between a positive supply rail voltage +Vdd and a negative power supply rail voltage −Vdd, and these signals are always of opposite polarity, so the differential signal applied across the load can only be either +2Vdd or −2Vdd (assuming that +Vdd is equal in magnitude to −Vdd).

In Class BD mode, the signal output at a point in time by the Class D amplifier can take one of three amplitude values: a high value; a low value; and an intermediate value between the high value and the low value. Thus, in Class BD mode the output signal is tri-level. This is shown schematically in the lower waveform diagram 120 of FIG. 1, which shows (in the lowermost waveform 122) a differential signal applied to a bridge-tied load by the output stage of a full bridge Class D amplifier, and corresponding output signals 124, 126 generated by first and second drivers of the output stage of the amplifier. In this example the output signals 124, 126 generated by the first and second drivers swing between a positive supply rail voltage +Vdd and a negative power supply rail voltage −Vdd. These outputs are sometimes of opposite polarity but also sometimes of the same polarity, and so the differential signal applied across the load can be either +2Vdd or −2Vdd (assuming that +Vdd is equal in magnitude to −Vdd) or 0V.

The choice of whether to design a particular Class D amplifier to operate in Class AD mode or Class BD mode depends upon the requirements of the particular application for which the Class D amplifier is to be used. Each mode offers different advantages and disadvantages.

SUMMARY

According to a first aspect, the invention provides Class D amplifier circuitry comprising: an input for receiving an input signal; first and second output nodes for driving a load connected between the first and second output nodes; a first driver stage for switching the first node between a first supply rail and a second supply rail; a second driver stage for switching the second node between the first supply rail and the second supply rail;

first driver control circuitry configured to receive a first carrier wave and control the switching of the first driver stage based in part on the first carrier wave; second driver control circuitry configured to receive a second carrier wave and control the switching of the second driver stage based in part on the second carrier wave; and a carrier wave generator configured to provide the first carrier wave and the second carrier wave, wherein a phase shift between the first carrier wave and the second carrier wave is adjustable responsive to a mode control signal.

The first driver control circuitry may be configured to receive a first signal derived from the input signal and control the switching of the first driver stage based in part on the first signal derived from the input signal; and the second driver control circuitry may be configured to receive a second signal derived from the input signal and control the switching of the second driver stage based in part on the second signal derived from the input signal.

In some embodiments the first and second signals derived from the input signal are complementary signals of a differential signal pair.

In other embodiments the first and second signals derived from the input signal are the same.

The first driver control circuitry may be operative to compare the first signal derived from the input signal to the first carrier wave and to control the switching of the first driver stage based on the comparison; and the second driver control circuitry may be operative to compare the second signal derived from the input signal to the second carrier wave and to control the switching of the second driver stage based on the comparison.

Alternatively or additionally, the first driver control circuitry may be operative to compare a first difference signal, indicative of a difference between a signal output by the first driver stage and a first signal derived from the input signal, to the first carrier wave and to control the switching of the first driver stage based on the comparison; and the second driver control circuitry may be operative to compare a second difference signal, indicative of a difference between a signal output by the second driver stage and a second signal derived from the input signal, to the second carrier wave and to control the switching of the second driver stage based on the comparison.

The first difference signal may, for example, represent an integral of a difference between a voltage of the signal output by the first driver stage and a voltage of the first signal derived from the input signal; and the second difference signal may represent an integral of a difference between a voltage of the signal output by the second driver stage and a voltage of the second signal derived from the input signal.

The first difference signal may be provided at an output of a first loop filter of the first driver control circuitry and the second difference signal may be provided at an output of a second loop filter of the second driver control circuitry.

The first driver control circuitry may comprise first integrator circuitry configured to receive a first digital signal and to generate the first carrier wave based on the received first digital signal; and the second driver control circuitry may comprise second integrator circuitry configured to receive a second digital signal and to generate the second carrier wave based on the received second digital signal.

The first digital signal and the second digital signal may comprise respective first and second square wave current waveforms.

In a first operating mode the phase shift between the first carrier wave and the second carrier wave may be substantially 180 degrees.

In a second operating mode the phase shift between the first carrier wave and the second carrier wave may be substantially zero.

In a third operating mode the phase shift between the first carrier wave and the second carrier wave may be a non-zero value other than 180 degrees.

The carrier wave generator may be operative to adjust the phase difference between the first and second carrier waves between a non-zero value and zero over a predetermined period of time in order to transition from the first or third operating mode to the second operating mode, and to adjust the phase difference between the first and second carrier waves between zero and a non-zero value over a predetermined period of time in order to transition from the second operating mode to the first or third operating mode.

The carrier wave generator may be operative to substantially continuously sweep the phase difference between the first and second carrier waves.

The Class D amplifier circuitry may further comprise monitoring circuitry configured to generate the mode control signal based on an indication, parameter, characteristic or feature of the input signal.

In one embodiment the monitoring circuitry is configured to monitor a parameter of the input signal and to generate a mode control signal to cause the Class D amplifier circuitry to transition from a first operating mode to a second operating mode if the monitored parameter of the input signal meets or falls below a first threshold and to generate a mode control signal to cause the Class D amplifier to transition from the second operating mode to the first operating mode if the monitored parameter of the input signal meets or exceeds a second threshold.

The monitored parameter of the input signal may comprise at least one of: an instantaneous signal level of the input signal; and an envelope of the input signal.

The second threshold may be different from the first threshold.

The monitoring circuitry may be configured to receive information about the input signal and to generate the mode control signal based on the received information. The received information may comprise at least one of: a received indication of the signal level of the input signal; a received indication of a forthcoming change in the signal level of the input signal; a received indication of a load attached to the class D amplifier circuitry; a received indication of a signal type of the input signal; and a received indication that a period of silence has been detected in an input audio signal.

The monitoring circuitry may be configured to generate the mode control signal based on at least one of: a signal level of an output signal of the Class D amplifier circuitry; an envelope of an output signal of the Class D amplifier circuitry; a duty cycle of a signal at the first or second output node; and a duty cycle of an output signal of the first or second driver control circuitry.

In an embodiment the carrier wave generator comprises: a source carrier wave input for receiving a source carrier wave; a first carrier wave output for outputting a first carrier wave; a second carrier wave output for outputting a second carrier wave; and a multiplexer. In this embodiment the source carrier wave input is coupled to the first carrier wave output and to a first input of the multiplexer; a second input of the multiplexer is configured to receive an inverted version of the source carrier wave; an output of the multiplexer is coupled to the second carrier wave output; and the multiplexer is configured to selectively couple its first input or its second input to its output in dependence on the mode control signal such that the carrier wave generator outputs either the source carrier wave or the inverted version of the source carrier wave at the second carrier wave output and outputs the source carrier wave at the first carrier wave output.

The carrier wave generator may comprise an inverting stage coupled between the source carrier wave input and the second input of the multiplexer.

In an embodiment, the carrier wave generator comprises: a source carrier wave input for receiving a source carrier wave; a first carrier wave output for outputting a first carrier wave; a second carrier wave output for outputting a second carrier wave; and a variable phase shift element. In this embodiment the source carrier wave input is coupled to the first carrier wave output and to an input of the variable phase shift element; an output of the variable phase shift element is coupled to the second carrier wave output; and the variable phase shift element is configured to apply a phase shift to the source carrier wave in dependence on the mode control signal and to output a phase shifted version of the source carrier wave as the second carrier wave.

The carrier wave generator may further comprise a further variable phase shift element coupled between the source carrier wave input and the first carrier wave output, wherein the further variable phase is configured to apply a phase shift to the carrier wave in dependence on the mode control signal and to output a phase shifted version of the source carrier wave as the first carrier wave.

The variable phase shift element or the further variable phase shift element may comprise at least one of: delay line circuitry; and all-pass filter circuitry.

In an embodiment, the carrier wave generator comprises: a source carrier wave input for receiving a source carrier wave; a first carrier wave output for outputting a first carrier wave; a second carrier wave output for outputting a second carrier wave; a delay line comprising a plurality of delay elements; and a multiplexer. In this embodiment, the source carrier wave input is coupled to the first carrier wave output and to an input of the delay line; outputs of each of the plurality of delay elements are coupled to inputs of the multiplexer; an output of the multiplexer is coupled to the second carrier wave output, and the multiplexer is configured to selectively couple its output to one of its inputs in dependence on the mode control signal.

The plurality of delay elements may form part of a phase locked loop comprising loop control circuitry, wherein the loop control circuitry is configured to output a control signal to each of the plurality of delay elements to adjust the delay of each of the plurality of delay elements so as to adjust a total delay of the delay line in order to phase-lock an output of the delay line to the source carrier wave.

In an embodiment, the carrier wave generator comprises: a first carrier wave output for outputting a first carrier wave;

a second carrier wave output for outputting a second carrier wave; a first ramp signal generator configured to output a ramp signal; a first comparator configured to compare the signal output by the first ramp signal generator to a first threshold and to output a signal when the output signal of the first ramp signal generator meets the first threshold; a second comparator configured to compare the signal output by the first ramp signal generator to a second threshold and to output a signal when the output signal of the first ramp signal generator meets the second threshold; a third comparator configured to compare the signal output by the first ramp signal generator to a third threshold and to output a signal when the output signal of the first ramp signal generator meets the third threshold; a fourth comparator configured to compare the signal output by the first ramp signal generator to a fourth threshold and to output a signal when the output signal of the first ramp signal generator meets the fourth threshold; a first bistable element having a first input coupled to an output of the first comparator and a second input coupled to an output of the second comparator; and a second bistable element having a first input coupled to an output of the third comparator and a second input coupled to an output of the fourth comparator, wherein an output of the first bistable element is coupled to the first carrier wave output and an output of the second bistable element is coupled to the second carrier wave output.

The first ramp signal generator may comprise a counter configured to receive a clock signal and to output a signal indicative of a number of clock pulses of the clock signal counted by the counter.

The carrier wave generator may further comprise a second ramp signal generator coupled between the output of the first bistable element and the first carrier wave output and a third ramp signal generator coupled between the output of the second bistable element and the second carrier wave output.

In an embodiment, the carrier wave generator comprises: a counter configured to receive a clock signal and to output a signal indicative of a number of clock pulses of the clock signal counted by the counter; and a state machine having an input coupled to an output of the counter and first and second outputs coupled to the first and second carrier wave outputs. In this embodiment the state machine is configured to output signals at its first and second outputs when the output of the counter meets a plurality of thresholds.

According to a second aspect of the invention there is provided Class D amplifier circuitry comprising: an input for receiving an input signal; first and second output nodes for driving a load coupled between the first and second output nodes; a first driver stage for switching the first node between a first supply rail and a second supply rail; a second driver stage for switching the second node between the first supply rail and the second supply rail; monitoring circuitry for outputting a mode control signal dependent on an indication of the input signal; and driver control circuitry for controlling the first and second driver stages dependent in part on the mode control signal so as to alter the relative phasing of switching transitions at the first and second output nodes.

The monitoring circuitry may be configured to monitor a parameter of the input signal and to generate a mode control signal to cause the Class D amplifier circuitry to transition from a first operating mode to a second operating mode if the monitored parameter of the input signal meets or falls below a first threshold and to generate a mode control signal to cause the Class D amplifier to transition from the second operating mode to the first operating mode if the monitored parameter of the input signal meets or exceeds a second threshold.

The monitored parameter of the input signal may comprise at least one of: an instantaneous signal level of the input signal; and an envelope of the input signal.

The second threshold may be different from the first threshold.

The monitoring circuitry may be configured to receive information about the input signal and to generate the mode control signal based on the received information, and the received information may comprise at least one of: a received indication of the signal level of the input signal; a received indication of a forthcoming change in the signal level of the input signal; a received indication of a load attached to the class D amplifier circuitry; a received indication of a signal type of the input signal; and a received indication that a period of silence has been detected in an input audio signal.

The monitoring circuitry may be configured to generate the mode control signal based on at least one of: a signal level of an output signal of the Class D amplifier circuitry; an envelope of an output signal of the Class D amplifier circuitry; a duty cycle of a signal at the first or second output node; and a duty cycle of an output signal of the first or second driver control circuitry.

The first driver control circuitry may be configured to receive a first signal derived from the input signal and control the switching of the first driver stage based in part on the first signal derived from the input signal; and the second driver control circuitry may be configured to receive a second signal derived from the input signal and control the switching of the second driver stage based in part on the second signal derived from the input signal.

The first and second signals derived from the input signal may be complementary signals of a differential signal pair.

Alternatively, the first and second signals derived from the input signal may be the same.

The first driver control circuitry may be operative to compare the first signal derived from the input signal to the first carrier wave and to control the switching of the first driver stage based on the comparison; and the second driver control circuitry may be operative to compare the second signal derived from the input signal to the second carrier wave and to control the switching of the second driver stage based on the comparison.

The first driver control circuitry may be operative to compare a first difference signal, indicative of a difference between a signal output by the first driver stage and a first signal derived from the input signal, to the first carrier wave and to control the switching of the first driver stage based on the comparison; and the second driver control circuitry may be operative to compare a second difference signal, indicative of a difference between a signal output by the second driver stage and a second signal derived from the input signal, to the second carrier wave and to control the switching of the second driver stage based on the comparison.

The first difference signal may represent an integral of a difference between a voltage of the signal output by the first driver stage and a voltage of the first signal derived from the input signal; and the second difference signal may represent an integral of a difference between a voltage of the signal output by the second driver stage and a voltage of the second signal derived from the input signal.

The first difference signal may be provided at an output of a first loop filter of the first driver control circuitry and the second difference signal may be provided at an output of a second loop filter of the second driver control circuitry.

The first driver control circuitry may comprise first integrator circuitry configured to receive a first digital signal and to generate the first carrier wave based on the received first digital signal; and the second driver control circuitry may comprise second integrator circuitry configured to receive a second digital signal and to generate the second carrier wave based on the received second digital signal.

The first digital signal and the second digital signal may comprise respective first and second square wave current waveforms.

The Class D amplifier circuitry may further comprise a carrier wave generator configured to provide the first carrier wave and the second carrier wave, wherein a phase shift between the first carrier wave and the second carrier wave is adjustable responsive to a mode control signal.

In a first operating mode the phase shift between the first carrier wave and the second carrier wave may be substantially 180 degrees.

In a second operating mode the phase shift between the first carrier wave and the second carrier wave may be substantially zero.

In a third operating mode the phase shift between the first carrier wave and the second carrier wave may be a non-zero value other than 180 degrees.

The carrier wave generator may be operative to adjust the phase difference between the first and second carrier waves between a non-zero value and zero over a predetermined period of time in order to transition from the first or third operating mode to the second operating mode and to adjust the phase difference between the first and second carrier waves between zero and a non-zero value over a predetermined period of time in order to transition from the second operating mode to the first or third operating mode.

The carrier wave generator may be operative to substantially continuously sweep the phase difference between the first and second carrier waves.

In an embodiment, the carrier wave generator comprises: a source carrier wave input for receiving a source carrier wave; a first carrier wave output for outputting a first carrier wave; a second carrier wave output for outputting a second carrier wave; and a multiplexer. In this embodiment the source carrier wave input is coupled to the first carrier wave output and to a first input of the multiplexer; a second input of the multiplexer is configured to receive an inverted version of the source carrier wave; an output of the multiplexer is coupled to the second carrier wave output; and the multiplexer is configured to selectively couple its first input or its second input to its output in dependence on the mode control signal such that the carrier wave generator outputs either the source carrier wave or the inverted version of the source carrier wave at the second carrier wave output and outputs the source carrier wave at the first carrier wave output.

The carrier wave generator may comprise an inverting stage coupled between the source carrier wave input and the second input of the multiplexer.

In an embodiment, the carrier wave generator comprises: a source carrier wave input for receiving a source carrier wave; a first carrier wave output for outputting a first carrier wave; a second carrier wave output for outputting a second carrier wave; and a variable phase shift element. In this embodiment the source carrier wave input is coupled to the first carrier wave output and to an input of the variable phase shift element; an output of the variable phase shift element is coupled to the second carrier wave output; and the variable phase shift element is configured to apply a phase shift to the source carrier wave in dependence on the mode control signal and to output a phase shifted version of the source carrier wave as the second carrier wave.

The carrier wave generator may further comprise a further variable phase shift element coupled between the source carrier wave input and the first carrier wave output, wherein the further variable phase is configured to apply a phase shift to the carrier wave in dependence on the mode control signal and to output a phase shifted version of the source carrier wave as the first carrier wave.

The variable phase shift element or the further variable phase shift element may comprises at least one of: delay line circuitry; and all-pass filter circuitry.

In an embodiment the carrier wave generator comprises: a source carrier wave input for receiving a source carrier wave; a first carrier wave output for outputting a first carrier wave; a second carrier wave output for outputting a second carrier wave; a delay line comprising a plurality of delay elements; and a multiplexer. In this embodiment the source carrier wave input is coupled to the first carrier wave output and to an input of the delay line; outputs of each of the plurality of delay elements are coupled to inputs of the multiplexer; an output of the multiplexer is coupled to the second carrier wave output, and the multiplexer is configured to selectively couple its output to one of its inputs in dependence on the mode control signal.

The plurality of delay elements may form part of a phase locked loop comprising loop control circuitry, wherein the loop control circuitry is configured to output a control signal to each of the plurality of delay elements to adjust the delay of each of the plurality of delay elements so as to adjust a total delay of the delay line in order to phase-lock an output of the delay line to the source carrier wave.

In an embodiment, the carrier wave generator comprises: a first carrier wave output for outputting a first carrier wave; a second carrier wave output for outputting a second carrier wave; a first ramp signal generator configured to output a ramp signal; a first comparator configured to compare the signal output by the first ramp signal generator to a first threshold and to output a signal when the output signal of the first ramp signal generator meets the first threshold; a second comparator configured to compare the signal output by the first ramp signal generator to a second threshold and to output a signal when the output signal of the first ramp signal generator meets the second threshold; a third comparator configured to compare the signal output by the first ramp signal generator to a third threshold and to output a signal when the output signal of the first ramp signal generator meets the third threshold; a fourth comparator configured to compare the signal output by the first ramp signal generator to a fourth threshold and to output a signal when the output signal of the first ramp signal generator meets the fourth threshold; a first bistable element having a first input coupled to an output of the first comparator and a second input coupled to an output of the second comparator; and a second bistable element having a first input coupled to an output of the third comparator and a second input coupled to an output of the fourth comparator, wherein an output of the first bistable element is coupled to the first carrier wave output and an output of the second bistable element is coupled to the second carrier wave output.

The first ramp signal generator may comprise a counter configured to receive a clock signal and to output a signal indicative of a number of clock pulses of the clock signal counted by the counter.

The carrier wave generator may further comprise a second ramp signal generator coupled between the output of the first bistable element and the first carrier wave output and a third ramp signal generator coupled between the output of the second bistable element and the second carrier wave output.

In an embodiment, the carrier wave generator comprises: a counter configured to receive a clock signal and to output a signal indicative of a number of clock pulses of the clock signal counted by the counter; and a state machine having an input coupled to an output of the counter and first and second outputs coupled to the first and second carrier wave outputs, wherein the state machine is configured to output signals at its first and second outputs when the output of the counter meets a plurality of thresholds.

According to a third aspect of the invention there is provided Class D amplifier circuitry comprising: a mode controller configured to dynamically adjust an operational switching mode of the Class D amplifier over a range between a Class AD mode and a Class BD mode in dependence on an indication of a level of an input signal to be amplified.

The range between the class AD mode and the class BD mode may have a first end point at which the operational switching mode is 100% Class AD and a second end point at which the operational switching mode is 100% Class BD. However, it is to be understood that the first end point of the range may correspond to an operational switching mode that is less than 100% class AD and/or the second end point of the range may correspond to an operational switching mode that is less than 100% class BD.

According to a fourth aspect of the invention there is provided Class D amplifier circuitry comprising: first and second half-bridge output stages; and a mode controller configured to dynamically adjust the relative phase of cyclic references applied to respective switching controllers of the first and second half-bridge output stages so as to dynamically adjust an operational switching mode of the Class D amplifier over a range between a Class AD mode and a Class BD mode.

According to a fifth aspect of the invention there is provided an electronic apparatus comprising Class D amplifier circuitry according to any one of the first to fourth aspects, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

BRIEF DESCRIPTION OF THE DRAWINGS

Embodiments of the invention will now be described, strictly by way of example only, with reference to the accompanying drawings, of which:

FIG. 3c provides schematic representations of different implementations of a carrier wave generator used in the circuit implementations of FIGS. 3a and 3b;

DETAILED DESCRIPTION

As mentioned above, Class AD and Class BD designs of a Class D amplifier offer different advantages and disadvantages.

Class AD designs offer high linearity and balance. However, the power supply rejection ratio (PSRR) in Class AD designs is worse relative to Class BD designs. As discussed above, in a full bridge Class D amplifier that drives a bridge-tied load, output signals generated by the first and second output drivers of the output stage typically swing between the positive and negative power supply rails, even for low signal levels, so any noise that is present in the power supply rails is carried into the signal applied to the load.

Further, the amplifier draws a higher quiescent current in Class AD mode than in Class BD mode.

In contrast, Class BD designs offer better power-supply rejection ratio (PSRR) than Class AD designs. Additionally, Class BD mode offers lower quiescent current than Class AD mode. However, these advantages come at the cost of lower linearity than Class AD mode and higher amplitude common mode signals.

Since Class AD only employs two output states, the output linearity is not sensitive to any mismatch in output amplitude between these two states. In contrast, the output of a Class BD design will employ three output states in various proportions according to the instantaneous input signal level, so any mismatch in output amplitude will cause non-linearity. Also since the outputs of a Class AD design are inherently complementary in polarity, the output common-mode voltage is constant, whereas in Class BD there is a common-mode ripple even with a small signal, since the output will alternate between a state in which both outputs are high and a state in which both outputs are low. This can give rise to electromagnetic interference (EMI) emissions.

Figure 2:
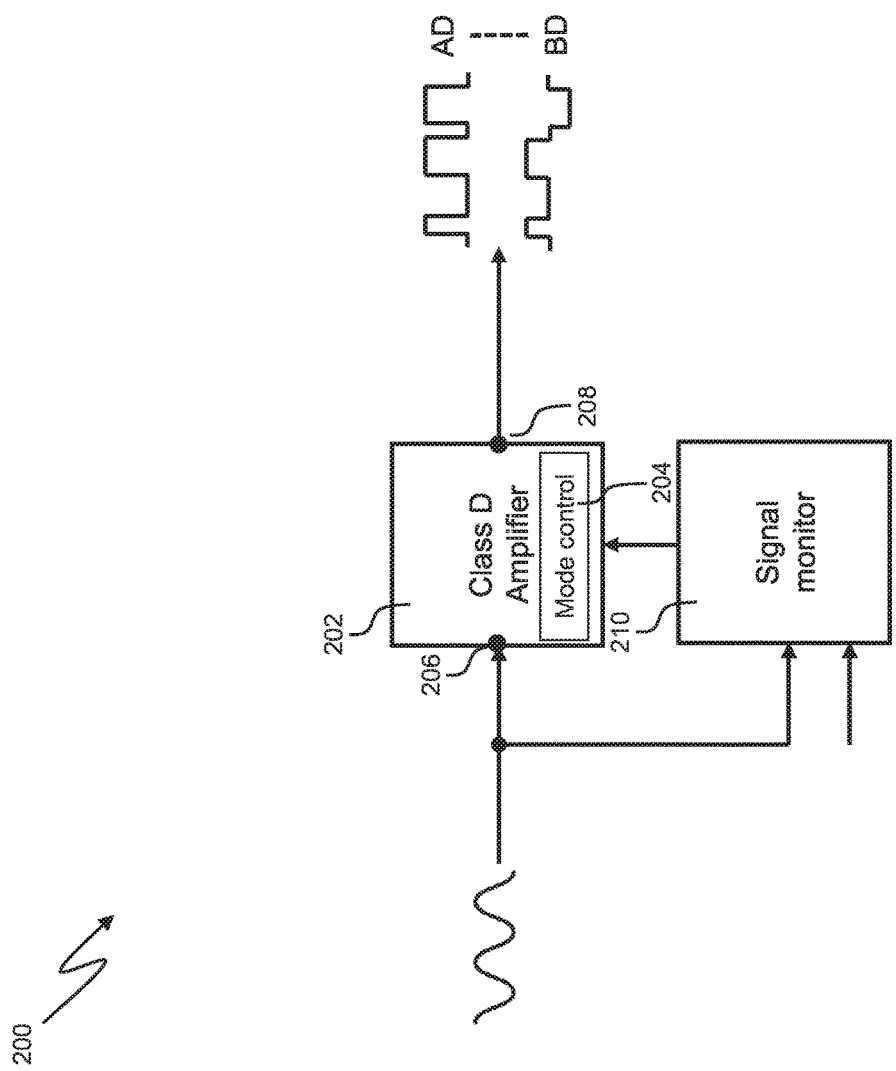
FIG. 2 is a schematic diagram illustrating the concept of a Class D amplifier that is selectively operable in Class AD mode or Class BD mode according to a characteristic, parameter, feature or the like, such as a signal level of an input signal.

FIG. 2 is a schematic diagram illustrating a Class D amplifier system configured to switch dynamically between Class AD and Class BD modes of operation according to a characteristic, parameter, feature or the like, such as a signal level of an input signal.

The system, shown generally at 200, includes a Class D amplifier 202 which is capable of operating in Class AD mode or in Class BD mode. The Class D amplifier 202 comprises a mode control mechanism 204, for switching the Class D amplifier 202 between a Class AD operating mode and a Class BD operating mode. The Class D amplifier 202 has an input terminal 206 for receiving an input signal and an output terminal 208 (or in the case of a full bridge amplifier, a pair of output terminals) for outputting a sequence of pulses, which deliver an output signal indicative of the input signal, to a load.

A signal monitor 210 may be coupled to the input terminal 206 of the Class D amplifier, and is configured to monitor the analogue input signal and to output a control signal to the mode control mechanism 204 of the Class D amplifier 202 to cause the Class D amplifier 202 to switch between Class AD mode and Class BD mode, according to an indication, or a characteristic, parameter, feature or the like of the input signal, such as the input signal level, for example.

The signal monitor 210 may be configured to operate in a number of different ways. For example, the signal monitor 210 may be configured to monitor the instantaneous signal level of the input signal and to output a control signal to cause the Class D amplifier 202 to transition to either its Class AD operating mode or its Class BD operating mode, or vice-versa, dependant on which particular conditions are met. For example, the signal monitor 210 may be configured to output a control signal to cause the Class D amplifier 202 to transition from Class AD mode to Class BD mode if the instantaneous input signal level meets or drops below a first predefined threshold, and to output a control signal to cause the Class D amplifier 202 to transition from Class BD mode to Class AD mode if the instantaneous input signal level meets or exceeds a second predefined threshold.

Alternatively, the signal monitor 210 may be configured to monitor a parameter, characteristic, feature or the like (e.g. an envelope level) of an envelope of the input signal and to output a control signal to cause the Class D amplifier 202 to switch its operating mode if particular conditions are met. For example, the signal monitor 210 may be configured to output a control signal to cause the Class D amplifier 202 to transition from Class AD mode to Class BD mode if an envelope parameter (e.g. the envelope level) of the input signal meets or drops below a first predefined threshold, and to output a control signal to cause the Class D amplifier 202 to transition from Class BD switching mode to Class AD switching mode if the envelope parameter (e.g. the envelope level) of the input signal meets or exceeds a second predefined threshold.

Advantageously the envelope detector used may have a relatively fast attack time constant so as to react quickly to any increases in input signal amplitude to change to Class AD mode in a timely fashion. Conversely, the envelope detector may have a relatively slower decay time constant so as to delay response to any decrease in signal amplitude to avoid over-frequent changes of switching mode. The envelope detector may further implement a hold period where the current value of the envelope level is maintained for the hold period before being reduced, to delay any changes in switching mode, effectively supplying a time-domain hysteresis to the mode switching so as to avoid over-frequent changes of switching mode.

In either case, the first and second predefined envelope parameter (e.g. envelope level) thresholds may be the same, or may be different to provide some hysteresis. The envelope thresholds may be a given fraction of the maximum expected input signal amplitude, e.g. a threshold may be set at a level of say 10% or 20% or any desired fraction of the expected maximum input signal amplitude, for example a threshold may be set in the range of 5-25% of the maximum signal amplitude, e.g. level, with the other threshold 5-10% different to provide voltage hysteresis. Additionally or alternatively, the envelope thresholds may be expressed in decibels relative to full scale (dBFS) of the maximum expected input signal amplitude, e.g. a threshold may be set at a level of between −6 dB to −30 dB, with the other threshold being set at a different level of between −6 dB to −12 dB, for example, so as to provide voltage hysteresis.

As a further alternative, the signal monitor may be configured to receive information about the input signal, such as its level for example, from one or more upstream components of the system 200 such as a volume control or some digital peak or envelope detector, and to output control signals to cause the Class D amplifier 202 to switch operating modes based on the received information. An indication, or a characteristic, parameter, feature or the like of the input signal may additionally or alternatively be deduced from high-level operating information in a host system. For example, a high-level system controller in a host device, such as a mobile phone, may know whether the output is connected to a 10 kΩ line-level load or to 600Ω speakers or to a more sensitive 8Ω low-impedance headphone load with a defined smaller permissible maximum signal level such that Class BD operation is desired even at the reduced maximum permissible signal level. Similarly a system controller may be able to anticipate a forthcoming change in the input signal level such as a temporary period of silence, or anticipate an imminent change in a class or type of input signal leading to a requirement to output, for example, a high-amplitude notification such as a ring tone instead of a regular audio signal. The high-level controller may communicate this information to the Class D amplifier to provide an indication of the input signal.

In the embodiments described above, the characteristic, parameter or feature of the amplitude of the input signal may be derived from monitoring the received input signal or from a volume control signal or some other upstream signal. In other embodiments however the parameter of the amplitude of the input signal may be derived at least in part from other parts of the signal chain within the Class D amplifier circuitry and used to alter the switching mode (Class AD/Class BD) accordingly. For instance an output voltage of the amplifier circuitry 300 can be used, either before filtering by looking at the duty cycle of signals at the output nodes 324, 332 or after filtering by comparison to a reference voltage, to provide an indication of the input signal level. Likewise the timing or duty cycle of control signals used to control the output stage 312, 314 switching can be used to provide a feature of the input signal level.

Embodiments may use digital hardware, e.g. counters, for determining the pulse width or duty cycle of the drive or control signals for the output driver stages and thus provide a method of controlling the switching mode using a small amount of purely digital hardware. This is especially advantageous in the case of a system with analogue inputs and thus no upstream digital representation of the input signal, or for amplifiers on small geometry manufacturing processes.

Other embodiments may take the output signal, either direct from the output driver stages, possibly with some filtering, or after a smoothing post filter between the output and a physical load, and derive an envelope thereof for processing similar to that described for processing an input signal to provide a signal to control the switching mode (Class AD/Class BD) of the Class D amplifier. In some embodiments the analogue output signal may be passed through an analogue to digital converter (ADC), perhaps to implement some other digital signal processing, e.g. linearization or digital echo cancellation. Digital envelope detection or other digital filtering may be employed to provide an indication of the output and hence input signal level.

Preferably such an ADC would be a continuous-time ADC, i.e. one which does not sample its input signal, to allow accurate capturing of the duty cycle and any transients arising around switching edges without having to run at an excessive sampling frequency. Such ADCs include continuous time delta-sigma converters and converters including voltage-to-frequency converters or voltage-controlled oscillators.

As a further alternative, the signal monitor 210 may be configured to receive information about other aspects of operation of a host system, in addition to or instead of information about the input signal. For instance, as mentioned above, Class BD operation may generate more EMI emissions due to the generally greater common-mode output voltage activity. This may give problems, for instance if the host device comprises a component which may try to receive radio signals of a similar carrier frequency as the cycle frequency of the Class D amplifier. The signal monitor may thus receive a control signal from say a high-level system controller in a host device, such as a mobile phone, indicating that EMI-sensitive functions are currently being activated so that Class AD operation is to be preferred even for small audio signal levels.

Figure 1:
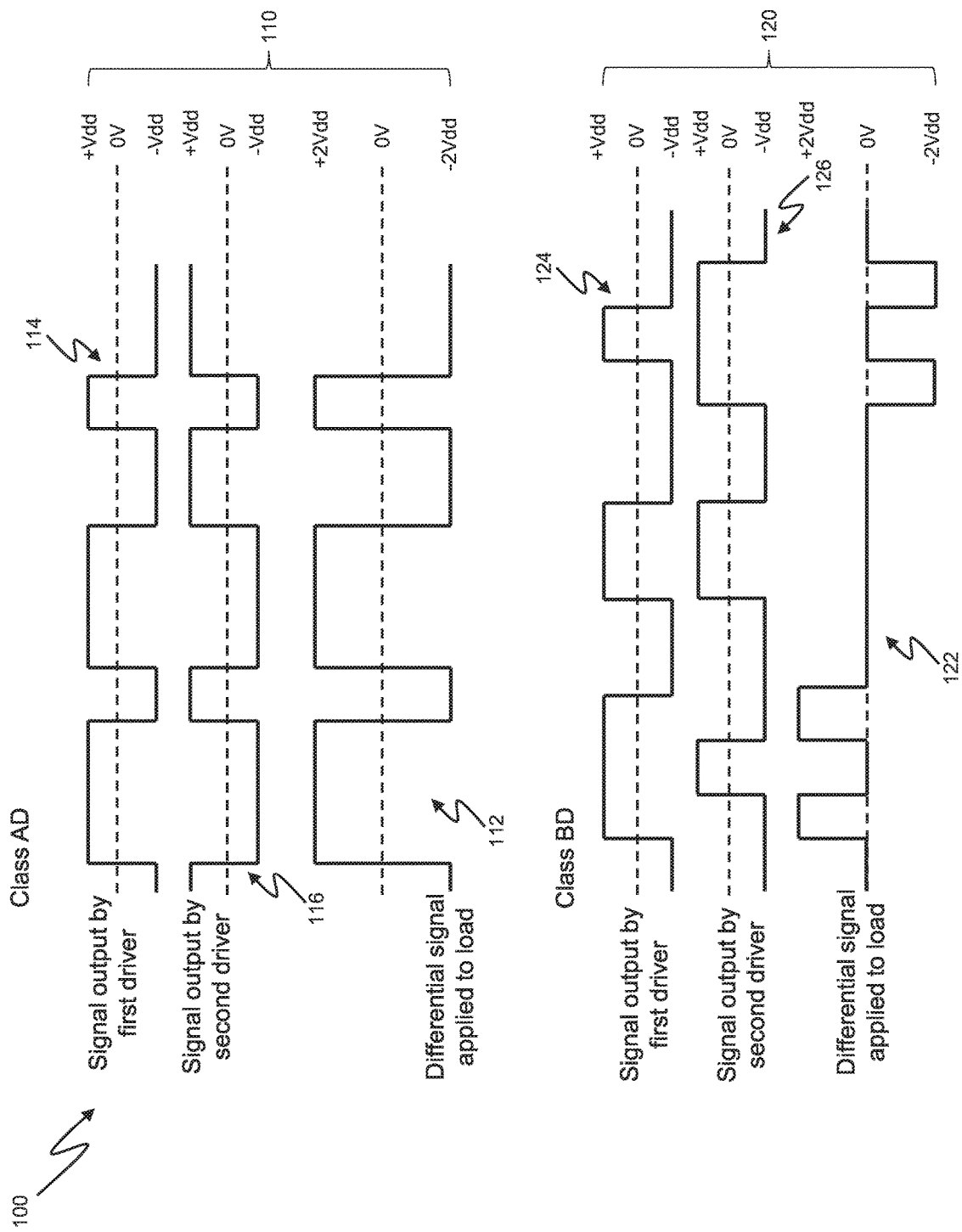
FIG. 1 is a schematic representation of output signals supplied to a load by Class D amplifiers operating in Class AD mode or operating in Class BD mode.
Figure 3A:
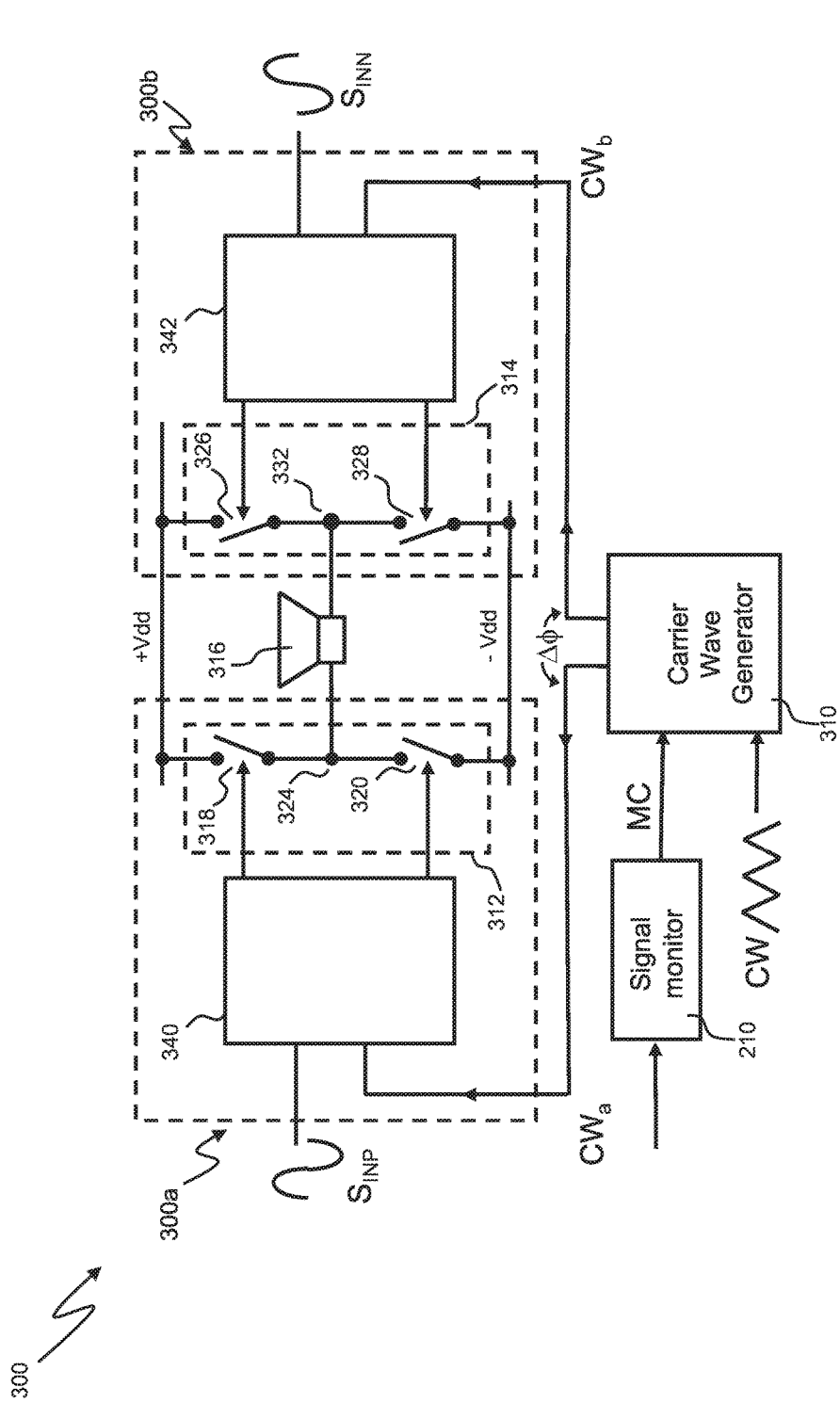
FIGS. 3a and 3b are schematic representations of circuit implementations of the concept illustrated in FIG. 2 for a bridge-tied load.

FIG. 3a is a schematic representation of an example circuit implementation of the concept illustrated in FIG. 2, which receives a differential input signal pair $S_{INP}$, $S_{INN}$ derived from an input signal such as an analogue audio signal and drives a first node 324 and a second node 332 of a bridge-tied load 316 with a differential output signal of the types shown in FIG. 1.

The circuit 300 of FIG. 3a comprises a first half-circuit 300a, a second half-circuit 300b, a carrier wave generator 310 and a signal monitor 210.

First half-circuit 300a comprises a first driver stage 312 for switching the first node 324 between either a first supply rail +Vdd or a second supply rail −Vdd and also comprises first driver control circuitry 340 configured to receive a first carrier wave $CW_a$ and control the switching of the first driver stage 312 based on the first carrier wave $CW_a$ and a first input signal component $S_{INP}$. Similarly second half-circuit 300b comprises a second driver stage 342 for switching the second node 332 between either the first supply rail +Vdd or the second supply rail −Vdd and also comprises second driver control circuitry 342 configured to receive a second carrier wave $CW_b$ and control the switching of the second driver stage 314 based on the second carrier wave $CW_b$ and a second input signal component $S_{INN}$.

Carrier wave generator 310 receives a source carrier wave CW and generates the first carrier wave $CW_a$ and the second carrier wave $CW_b$. The carrier wave generator 310 adjusts a phase shift between the first carrier wave $CW_a$ and the second carrier wave $CW_b$, in response to a mode control signal MC. This mode control signal may be generated by the signal monitor block 210, which may monitor the input signal or a signal indicating a characteristic thereof such as a signal level of the input signal.

Figure 3B:
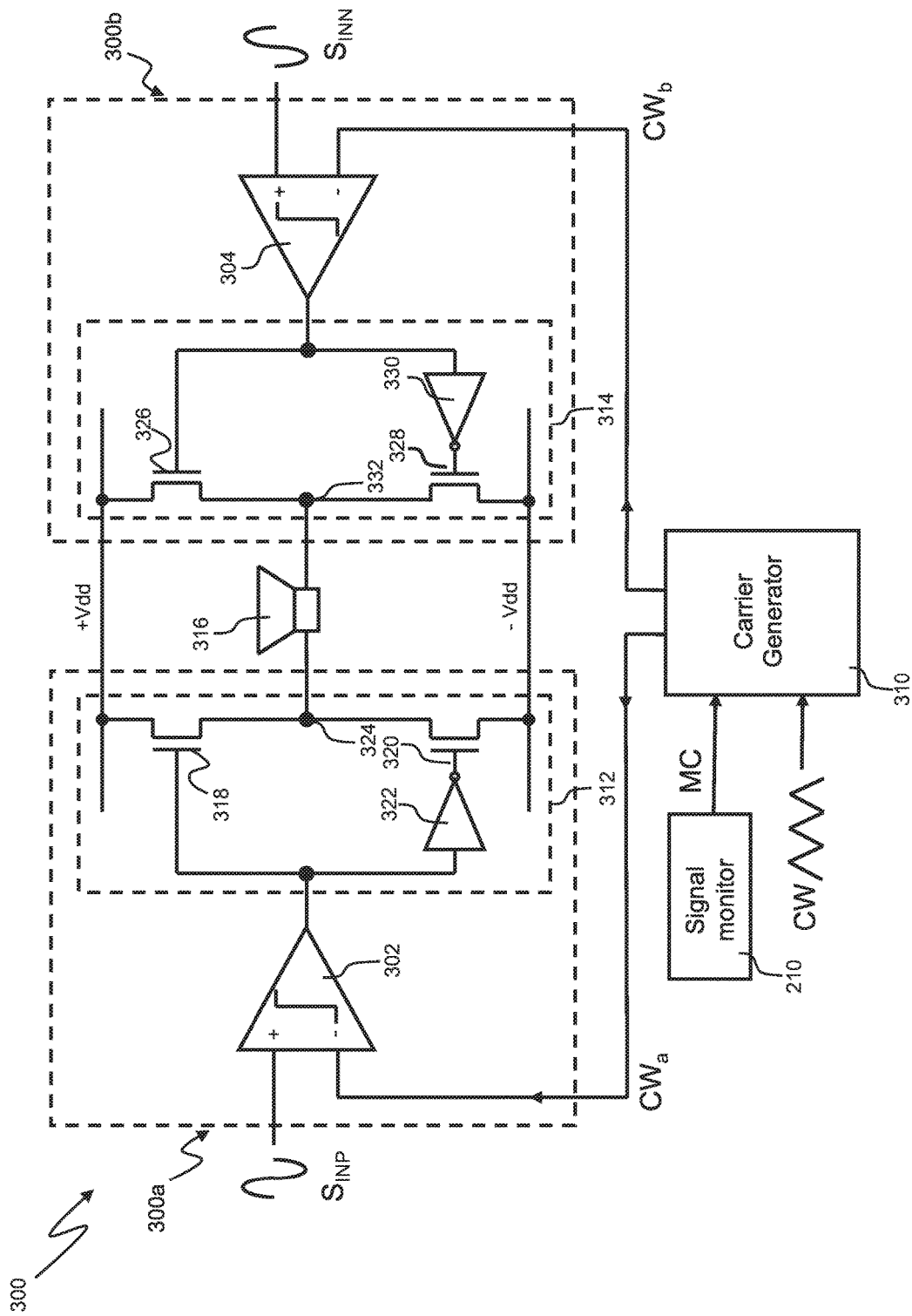

FIG. 3b is a more detailed schematic representation of an example circuit implementation 300 of the concept illustrated in FIG. 3a. Circuit 300 receives a differential input signal pair $S_{INP}$, $S_{INN}$ derived from an input signal such as an analogue audio signal and drives a bridge-tied load 316 with a differential output signal. The circuit 300 of FIG. 3b comprises two half-circuits 300a and 300b, each of which receives one of the differential input signals and drives a respective side of the load 316 from a respective driver stage 312 or 314.

In the circuit 300 of FIG. 3b, a first comparator 302 receives, at its non-inverting input, a first input signal $S_{INP}$ of the differential input signal pair. A second comparator 304 receives, at its non-inverting input, a second input signal $S_{INN}$ of the differential input signal pair, which is complementary to the first input signal, e.g. inverted with respect to some quiescent signal reference. An inverting input of the first comparator 302 is connected to an output of a carrier wave generator 310, and receives therefrom a first carrier wave $CW_a$ which, in this example, is a triangle wave. The carrier wave $CW_a$ is a repeating periodic signal i.e. a cyclic reference signal. A second output of the carrier wave generator 310 is connected to an inverting input of the second comparator 304 such that the carrier wave generator 310 supplies a second carrier wave to the second comparator 304. By altering the phase of the second carrier wave or cyclic reference signal that is supplied to the second comparator 304 the carrier wave generator 310 is able to adjust the operating mode of the circuit 300, as will be described in more detail below.

An output of the first comparator 302 drives a first driver stage 312 of the circuit 300, whilst an output of the second comparator 304 drives a second driver stage 314 of the circuit 300. Outputs of the first driver stage 312 and the second driver stage 314 are connected to respective first and second nodes 324, 332 which are connected to respective first and second terminals of a load 316, which in the example circuit 300 of FIG. 3b is shown as a loudspeaker (but which could be another audio transducer such as a headphone, earphone or earbud, or some other transducer, e.g. a haptic transducer such as a linear resonant actuator or other mechanical transducer). Thus the first comparator serves as first driver control circuitry, being configured to receive a first carrier wave $CW_a$ and control the switching of the first driver stage 312 based in part on the first carrier wave $CW_a$. Similarly the second comparator 304 serves as second driver control circuitry being configured to receive a second carrier wave $CW_b$ and control the switching of the second driver stage 314 based in part on the second carrier wave $CW_b$.

The first driver stage 312 may comprise first and second switching devices such as transistors connected in series between a positive supply rail +Vdd and a negative supply rail −Vdd of the circuit 300. A gate terminal of the first switching device 318 is connected to the output of the first comparator 302, whilst a gate terminal of the second switching device 320 is connected to an output of an inverter 322, which has an input that is connected to the output of the first comparator 302. An output of the first output portion 312 is provided by node 324 connecting a terminal of the first switching device 318 to a terminal of the second switching device 320. For example, the first switching device 318 may be an n-channel MOSFET (NMOS) having a drain terminal connected to the positive supply rail +Vdd. The second switching device 320 may be an n-channel MOSFET (NMOS) having a drain terminal connected to a source terminal of the first switching device 318, and a source terminal connected to the negative supply rail −Vdd. In this case the output of the first output portion 312 is provided by the node 324 connecting the source terminal of the first switching device 318 to the drain terminal of the second switching device 320.

The second driver stage 314 is similar to the first driver stage 312, and comprises third and fourth switching devices 326, 328 such as transistors connected in series between a positive supply rail +Vdd and a negative supply rail −Vdd of the circuit 300. A gate terminal of the third switching device 326 is connected to the output of the second comparator 304, whilst a gate terminal of the fourth switching device 328 is connected to an output of an inverter 330, which has an input that is connected to the output of the second comparator 304. An output of the second output portion 314 is provided by node 332 connecting a terminal of the third switching device 326 to a terminal of the fourth switching device 328. For example, the third switching device 326 may be an NMOS transistor having a drain terminal connected to the positive supply rail +Vdd. The fourth switching device 328 may be an NMOS transistor having a drain terminal connected to a source terminal of the third switching device 326, and a source terminal connected to the negative supply rail −Vdd. In this case the output of the second output portion 314 is provided by the node 332 connecting the drain terminal of the third switching device 326 to the source terminal of the fourth switching device 328.

It will be appreciated that alternative arrangements of switching devices providing equivalent functionality could equally be employed in the first and second driver stages 312 and 314. For example, all the four switching devices 318, 320, 326, 328 may be p-channel MOSFETs (PMOSs). The overall effect would be just to invert the polarity of the output signals on nodes 324 and 332 and hence invert the differential voltage across the load.

Alternatively, the second and fourth switching device 320, 328 may be n-channel MOSFETs (NMOSs) and the first and third switching devices 318, 326 may be p-channel MOSFETs (PMOSs) to provide CMOS output stages comprising complementary n- and p-channel switching devices. In this latter case, the inverters 322, 330 may be omitted.

It will also be appreciated that the MOS switching devices 318, 320, 326 and 328 may possibly not be driven directly from the comparator outputs. The output devices 318, 320, 326 and 328 may have to carry relatively high drive currents to and from the load 316 and thus may need to be larger than the general small-signal MOS circuitry such as found in the comparator. There may thus be one or more stages of intermediate pre-driver circuitry. This may also incorporate means to limit the output voltage slew rate or overlap or underlap of the detailed switching transitions. Intermediate pre-driver circuitry may also include means to avoid pulses of duration less than some minimum, say of the order of 1% or so of the switching period. However the switching devices are still essentially controlled by the respective switching control circuitry, e.g. the comparators 302, 304 of FIG. 3*b*.

Whilst the example circuit implementation 300 of FIG. 3*b* shows the series-connected first and second switching devices 318, 320 and the series-connected third and fourth switching devices 326, 328 being connected between positive and negative supply rails, it will be appreciated that in general any suitable arrangement of positive and negative supply rails could be used. For example, the positive supply rail may be at a positive voltage and the negative supply rail may be ground or a negative voltage of the same or a different magnitude to the positive supply rail.

In operation of the circuit 300, the first comparator 302 receives the first input signal $S_{INP}$ of the differential input signal pair and compares it to the first carrier wave $CW_a$ to generate an output signal to drive the first output portion 312. The second comparator 304 receives the second input signal $S_{INN}$ of the differential input signal pair and compares it to the second carrier wave $CW_b$ to generate an output signal to drive the second output portion 314. The signals output by the first and second output portions 312, 314 appear across the load 316 as a differential output signal.

Thus, when the output of the first comparator 302 is high, the first switching device 318 is in a switched on state and the second switching device 320 is in a switched off state (due to the inverting effect of the inverter 322). A low-impedance current path therefore exists between the positive supply rail +Vdd and the node 324, and the voltage at the node 324 is substantially equal to +Vdd.

When the output of the first comparator 302 is low, the first switching device 318 is in the switched off state and the second switching device 320 is in the switched on state (again, due to the inverting effect of the inverter 322). A low-impedance current path therefore exists between the negative supply rail −Vdd and the node 324, and the voltage at the node 324 is substantially equal to −Vdd.

When the output of the second comparator 304 is high, the third switching device 326 is in the switched on state and the fourth switching device 328 is in the switched off state (due to the inverting effect of the inverter 330). A low-impedance current path therefore exists between the positive supply rail +Vdd and the node 332, and the voltage at the node 332 is substantially equal to +Vdd.

When the output of the second comparator 304 is low, the third switching device 326 is in the switched off state and the fourth switching device 328 is in the switched on state (again, due to the inverting effect of the inverter 330). A low-impedance current path therefore exists between the negative supply rail −Vdd and the node 332, and the voltage at the node 332 is substantially equal to −Vdd.

In the Class AD mode of operation, a bi-level differential output signal whose value swings between +2Vdd and −2Vdd is generated across the load. This is achieved by switching the first and third switching devices 318, 326 on and off in antiphase. Thus, when the first switching device 318 is in the switched on state, the third switching device 326 is in the switched off state, and vice versa.

With the first switching device 318 in the switched on state and the third switching device 326 in the switched off state, a voltage substantially equal to +Vdd develops at the node 324 and a voltage substantially equal to −Vdd develops at the node 332. Thus, a differential output voltage equal to +Vdd −(−Vdd)=+2Vdd is present across the load 316 and current flows from left to right through the load 316. When the first switching device 318 is switched off and the third switching device 326 is switched on, a voltage substantially equal to −Vdd develops at the node 324 and a voltage substantially equal to +Vdd develops at the node 332. Thus, a differential output voltage equal to −Vdd−Vdd=−2Vdd is present across the load 316 and current flows from right to left through the load 316.

Thus, for Class AD operation, the output of the second comparator 304 is the inverse of the output of the first comparator 302, to ensure that the first and third switching devices 318, 326 are switched on and off in the correct sequence. The manner in which this can be achieved is described in detail below.

In the Class BD mode of operation, a tri-level differential output signal that can have an amplitude of +2Vdd, −2Vdd, or 0 v is generated across the load 316. This is achieved by selectively switching the first and third switching devices 318, 326 on and off, such that at some times the first and third switching devices 318, 326 can both be in an on state or both be in an off state, and at other times one of the first and third switching devices 318, 326 is in an on state while the other of the third and first switching devices 326, 318 is in an off state.

As discussed above, when the first switching device 318 is switched on and the second switching device 320 is switched off, a differential output voltage of +2Vdd develops across the load 316. When the first switching device 318 is switched off and the second switching device 320 is switched on, a differential output voltage of −2Vdd develops across the load 316.

If the first switching device 318 is in the on state at the same time as the third switching device 326 is in the on state, a voltage of +Vdd develops at the node 324 due to the connection between the positive supply rail +Vdd and the node 324. At the same time, a voltage of +Vdd develops at the node 332 due to the connection between the positive supply rail +Vdd and the node 332. Thus, when both the first switching device 318 and the third switching device 326 are switched on, a differential voltage of (+Vdd)−(+Vdd)=0 volts is present across the load 316.

Similarly, if the second switching device 320 is switched on at the same time as the fourth switching device 328 is switched on, a voltage of −Vdd develops at the node 324 due to the connection between the negative supply rail −Vdd and the node 324. At the same time, a voltage of −Vdd develops at the node 332 due to the connection between the negative supply rail −Vdd and the node 332. Thus, when both the second switching device 320 and the fourth switching device 328 are switched on, a differential voltage of (−Vdd)−(−Vdd)=0 volts is present across the load 316.

Thus, by configuring the circuit 300 such that different combinations of the first and third switching devices 318, 326 and the second and fourth switching devices 320, 328 are switched on at the same time, one of the three different differential output voltages +2Vdd, −2Vdd, or 0 v as described above can be generated and applied to the load 316.

The circuit 300 can be arranged to operate in Class AD mode or Class BD mode by adjusting a phase difference between the first carrier wave $CW_a$ (which is input to the inverting input of the first comparator 302) and the second carrier wave $CW_b$ (which is input to the inverting input of the second comparator 304).

If there is no phase difference between the first carrier wave $CW_a$ and the second carrier wave $CW_b$, the circuit 300 operates in Class BD mode, as any one of the three differential output voltages described above can be generated across the load 316 as a result of the outputs of the first and second comparators 302, 304.

On the other hand, if a phase shift of 180 degrees is applied to the second carrier wave $CW_b$ with respect to the first carrier $CW_a$, or equivalently, if the second carrier is inverted with respect to the first carrier, then the outputs of the first and second comparators 302, 304 will always be the inverse of one another, and a differential output voltage of 0 volts across the load 316 cannot be generated. Thus, the circuit 300 operates in Class AD mode.

In some embodiments, to avoid having to generate the inverse input signal $S_{INN}$, the same input signal could be connected to the inputs of both comparators. To compensate for the non-inversion of its signal input, the polarity of the second comparator inputs would be reversed such that the signal input would be applied to the inverting input of comparator 304 and the second carrier wave applied to the non-inverting input. In this example case, when no phase shift is applied to the second carrier $CW_b$ the circuit 300 operates in Class AD mode, whilst a phase shift applied to the second carrier $CW_b$ causes the circuit 300 to operate in Class BD mode.

To permit the circuit 300 to transition between Class AD and Class BD operation, the carrier wave generator 310 is configured to be controllable so as to invert or impart a phase shift to one carrier signal with respect to the other carrier signal in response to a received mode control signal MC. FIG. 3c illustrates various possible implementations of carrier wave generator 310.

In one approach, denoted 310a in FIG. 3c, the carrier wave generator 310 includes an inverting stage 356 and a multiplexer 358 and provides the first carrier wave $CW_a$ at a first carrier wave generator output 352 and the second carrier wave $CW_b$ at a second carrier wave generator output 354. An input of the inverting stage 356 is connected to an input of the carrier wave generator 310a so as to receive the source carrier wave CW, and an output of the inverting stage 356 is connected to a first input of the multiplexer 358. A second input of the multiplexer 358 is connected directly to the input of the carrier wave generator 310a, so as to receive the source carrier wave CW. Thus the first input of the multiplexer receives an inverted version $CW_b$ of the source carrier wave CW while the second input receives a non-inverted version $CW_a$ of the source carrier wave CW. An output of the multiplexer 358 is connected to the second output 354 of the carrier wave generator 310a, to provide the second carrier wave $CW_b$. When the circuit 300 is required to operate in Class AD mode (as determined, for example, by a signal monitor 210 of the kind described above with reference to FIG. 2), the carrier wave generator 310 receives a corresponding mode control signal MC which controls the multiplexer 358 so as to connect the output of the multiplexer 358 to the first input of the multiplexer, such that the carrier wave generator 310a outputs, as the second carrier $CW_b$, an inverted version $CW_b$ of the source carrier wave CW. Meanwhile the first carrier wave generator output 352 is connected (possibly via some non-inverting buffering) to the carrier wave generator input that receives the source carrier wave CW input and thus provides a non-inverted version of the source carrier wave as first carrier wave $CW_a$. Thus in this mode the carrier wave generator 310a provides the second carrier wave as an inverted version of the first carrier wave. As will be appreciated, providing an inverted version in this way is equivalent to establishing a phase shift of 180 degrees between the two carrier waves $CW_a$ and $CW_b$ or to providing a time delay equal to half a cycle period of the source carrier wave CW.

When the circuit 300 is required to operate in Class BD mode, the carrier wave generator 310a is operative to connect the output of the multiplexer 358 to the second input of the multiplexer 358, such that the carrier wave generator 310a outputs a non-inverted version of the source carrier wave as the second carrier wave output, i.e. equivalent to providing a non-inverted version of the first carrier wave, i.e. establishing zero degrees of phase difference or zero time delay between the two carrier wave outputs.

In some embodiments inverted and non-inverted versions of the source carrier wave CW may already be generated within upstream circuitry which generates the source carrier wave, so these non-inverted and inverted source carrier wave signals may be directly coupled via respective carrier wave generator inputs to the respective inputs of the multiplexer 358.

In an alternative approach, denoted 310b in FIG. 3c, the carrier wave generator 310 provides the first carrier wave $CW_a$ at a first carrier wave generator output 352 and the second carrier wave $CW_b$ at a second carrier wave output 354. The carrier wave generator 310b comprises a variable phase shift element 360. An input of the variable phase shift element 360 is connected to the input of the carrier wave generator 310b so as to receive the source carrier wave CW, and an output of the variable phase shift element 360 is connected to the second output 354 of the carrier wave generator 310b. When the circuit 300 is required to operate in Class AD mode (as determined, for example, by a signal monitor 210 of the kind described above with reference to FIG. 2), the carrier wave generator 310 receives a corresponding mode control signal MC which controls the variable phase shift element 360 such that it applies a phase shift of 180 degrees to the source carrier input signal, and thus the carrier wave generator 310b outputs, as the second carrier $CW_b$, this phase shifted version of the source carrier wave CW. Meanwhile the first carrier wave generator output 352 is connected (possibly via some non-inverting buffering) to the carrier wave generator input that receives the source carrier wave CW input and thus provides a non-inverted version of the source carrier wave without any phase shift as first carrier wave $CW_a$. Thus in this mode the carrier wave generator 310b provides the second carrier wave with 180 degrees of phase shift relative to the first carrier wave. As will be appreciated, providing a phase shift of 180 degrees between the two carrier waves in this way is equivalent to providing mutually inverted versions of the two carrier waves or to providing a time delay equal to half a cycle period of the source carrier wave. In contrast, when the circuit 300 is required to operate in Class BD mode, the variable phase shift element 360 does not apply any phase shift to the first carrier, and so the second carrier wave has zero degrees of phase shift relative to the first carrier wave, i.e. there is zero time delay between the two carrier wave outputs.

In some variants it may be convenient to apply a variable phase delay to both paths, for instance controllably applying 90 degrees phase lead in the path providing the first carrier wave and 90 degrees phase lag in the path providing the first carrier wave to provide an equivalent phase difference of 180 degrees between the two paths. Thus, the carrier wave generator 310b may comprise a further variable phase shift element 362 coupled between the input of the carrier wave generator 310b and the first output 352 of the carrier wave generator 310b and operative to apply a variable phase delay to the source carrier that is complementary to a phase delay applied by the variable phase shift element in accordance with the received mode control signal MC so as to implement a relative phase delay of 180 degrees between the first and second carrier waves output by the carrier wave generator 310b.

The variable phase shift element may comprise known analog techniques for applying a phase delay or time delay to a signal, for instance a delay line or all-pass filter circuit, which may be bypassed when zero phase delay is required. Also in some embodiments of the driver control circuitry 340 (e.g. as discussed below with reference to FIG. 6) the carrier wave may be supplied to the driver control circuitry as a digital signal, which may be a simple two-level signal, in which case a digital delay line may be employed.

In embodiments discussed so far, the mode control signal MC may be a two-level signal and the amplifier circuitry 300 may be configured to operate in Class AD or Class BD modes only. In some embodiments, the variable phase element 360 may be controlled by the carrier wave generator 310b to impart different phase shifts to the first carrier, so as to "tune" the operating mode of the circuit 300 to adjust the duration (nominally zero in Class AD mode) of each instance of the 0 volts output state in the differential output signal, for example according to properties of the input signal such as its signal level.

In such embodiments the signal monitor may supply a multi-level mode control signal MC associated for example with comparing a multi-level indication of input signal level against multiple thresholds associated with or corresponding to multiple different modes ranging from Class AD to Class BD, i.e. operating in one or more intermediate "ADBD" modes.

In some embodiments the mode of operation may be ramped over time, even when the indication of signal is compared only to a single threshold so that the mode control signal is binary, between a full AD to a full BD. For example, in order to transition from a Class AD mode or an intermediate "ADBD" mode of operation to a Class BD mode of operation, the carrier wave generator 310 may adjust the phase shift between the first and second carrier waves from a non-zero value such as 180 degrees to zero over a predetermined period of time. Similarly, in order to transition from the Class BD mode to the class AD mode or an intermediate "ADBD" mode, the carrier wave generator may adjust the phase shift between the first and second carrier waves from zero to a non-zero value (such as 180 degrees for full Class AD mode) over a predetermined period of time. In some embodiments the range of operation may be restricted to just a subset of the complete range from Class AD to Class BD. Thus more generally, in order to change the mode of operation of the Class D amplifier from one mode to another, the carrier wave generator may adjust the phase shift between the first and second carrier waves from a first value to a second value over a predetermined period of time where one of the first value or the second value may be zero or neither is zero and where one of the first value or the second value may be 180 degrees or neither is 180 degrees.

In some embodiments the switching frequency may be varied in a substantially continuous manner with signal amplitude over at least a first range of signal amplitudes by substantially continuously sweeping the phase delay introduced by the carrier wave generator.

In a further example of a carrier wave generator, denoted 310c in FIG. 3c, the carrier wave generator 310 again provides the first carrier wave $CW_a$ at a first carrier wave generator output 352 and the second carrier wave $CW_b$ at a second carrier wave output 354. The carrier wave generator 310c comprises a delay line comprising a plurality of delay elements 370, 372 and 374. The carrier wave generator 310c provides the first carrier wave from a node which also serves as the input to the first delay element 370.

The carrier wave generator 310c provides the second carrier wave from the output of a multiplexer 376 which under control of the mode control signal MC selects an input or output of a selected one of the plurality of delay elements 370, 372 or 374. Thus the second carrier output $CW_b$ may subjected to a controllable number of delay increments under control of mode control signal MC depending on whether Class AD, Class BD, or some intermediate mode of operation is required. In some variants the source carrier wave may be applied directly to the input of the first delay element 370, and the delay introduced by each element controlled by design. In the example as illustrated however the delay elements comprise a part of a phase locked loop comprising loop control circuitry 378 which may itself comprise a phase detector and a loop filter or similar and which outputs a control signal VC which adjusts the delay of each element via a respective control port. In operation this control signal adjusts the total delay of the delay line until the output of the delay line is locked in phase with the source signal, thus providing a delay per element of 1/N of the source carrier wave period. The delay elements may be digital gates for example a CMOS inverter with VC controlling a supply rail or back bias voltage or may be voltage-controlled analog delay stages for example using voltage-controlled transconductances or capacitances. The delay line and multiplexer may be considered a variable phase element.

In a further example of a carrier wave generator, denoted 310d in FIG. 3c, the carrier wave generator 310 again provides the first carrier wave $CW_a$ at a first carrier wave generator output 352 and the second carrier wave $CW_b$ at a second carrier wave output 354. In this example the carrier wave does not receive an explicit source carrier wave but instead provides the carrier wave outputs based on a received digital clock signal CLK. This clock is used to clock a counter 380, whose output is compared against a set of thresholds or comparison levels N1, N2, N3, N4, which together may be regarded as a mode control signal MC or may be generated in say a look-up table based on a different format of received mode control signal MC.

In operation, the output of the counter will ramp up as the number of pulses of the clock signal counted by the counter increases, passing the thresholds N1, N2, N3, N4. Digital comparators 382 detect when each threshold is crossed and deliver a respective pulse to set or reset a following flip-flop 384a or 384b. Thus flip-flop output signals Da and Db are controlled to switch low-to-high or high-to-low at times defined by N1 N2, N3, N4 etc. Where a binary digital level suffices for the operation of the driver control circuitry these outputs Da and Db may be used directly as the first and second carrier waves $CW_a$ and $CW_b$ respectively. If say a triangle wave is required then the digital signal may control ramp generators 386a and 386b to provide a triangle wave. The ramp generators may comprise digital-to-analog converters if an analog output is required. An analogous analog variant could be implements using an analog ramp signal and analog-input comparators to replace the counter and digital comparators.

In alternative embodiments similar operation may be obtained by employing a digital state machine in place of the digital comparators 382 and flip-flops 384a or 384b. The digital state machine has an input that is coupled to the output of the counter and first and second outputs coupled, respectively, to the first and second carrier wave outputs 352, 354 of the carrier wave generator 310d, and is operative, in use, to switch its outputs from a low state to a high state or from a high state to a low state at times defined by the thresholds N1-N4 as the output of the counter crosses each threshold.

In the example circuit 300 of FIG. 3b the first and second carriers are input to the inverting inputs of the first and second comparators 302, 304 (with a phase shift applied to the second carrier as appropriate) and the first and second signals of the differential input signal pair being received at the inverting inputs of the first and second comparators 302, 304, in order to generate control signals to control the first and second output portions 312, 314 of the circuit 300. It will be appreciated by those skilled in the art that alternative arrangements of the comparators 302, 304 could equally be employed to achieve the same effects. For example, the polarity of the connections of the comparators 302, 304 could be reversed so that first and second carriers (with a phase shift where appropriate) could be input to the non-inverting inputs of the first and second comparators 302, 304, with the first and second signals of the differential input signal pair being input to the inverting inputs of the comparators 302, 304. Operation would be similar to that described with respect to FIG. 3b except the differential output would be reversed in polarity, unless NMOS switches 318, 320, 326, 328 were also replaced by PMOS switches.

Figure 4A:
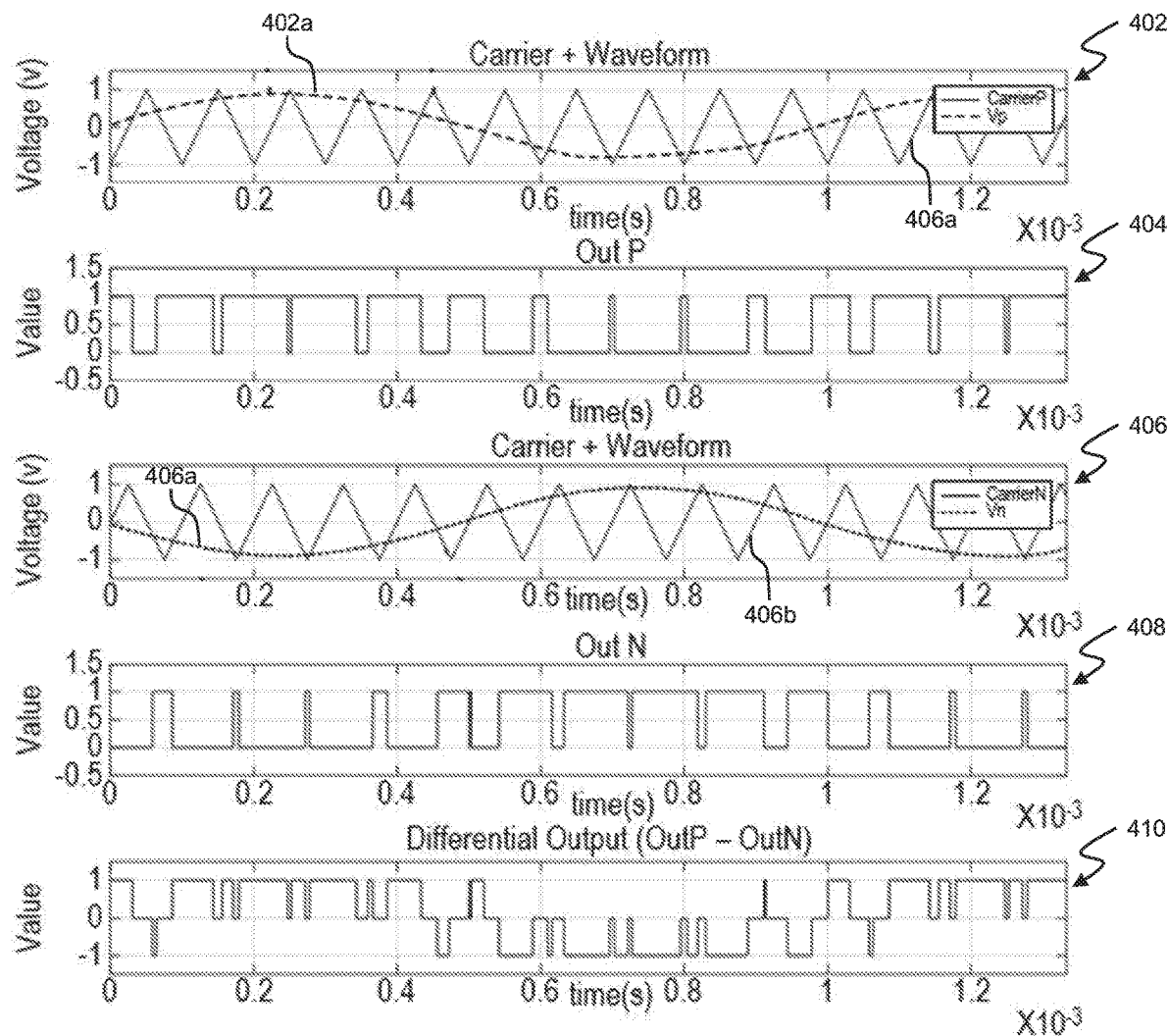
FIGS. 4a-4c show a series of waveforms illustrating the operation of the circuit implementations of FIGS. 3a and 3b.
Figure 4B:
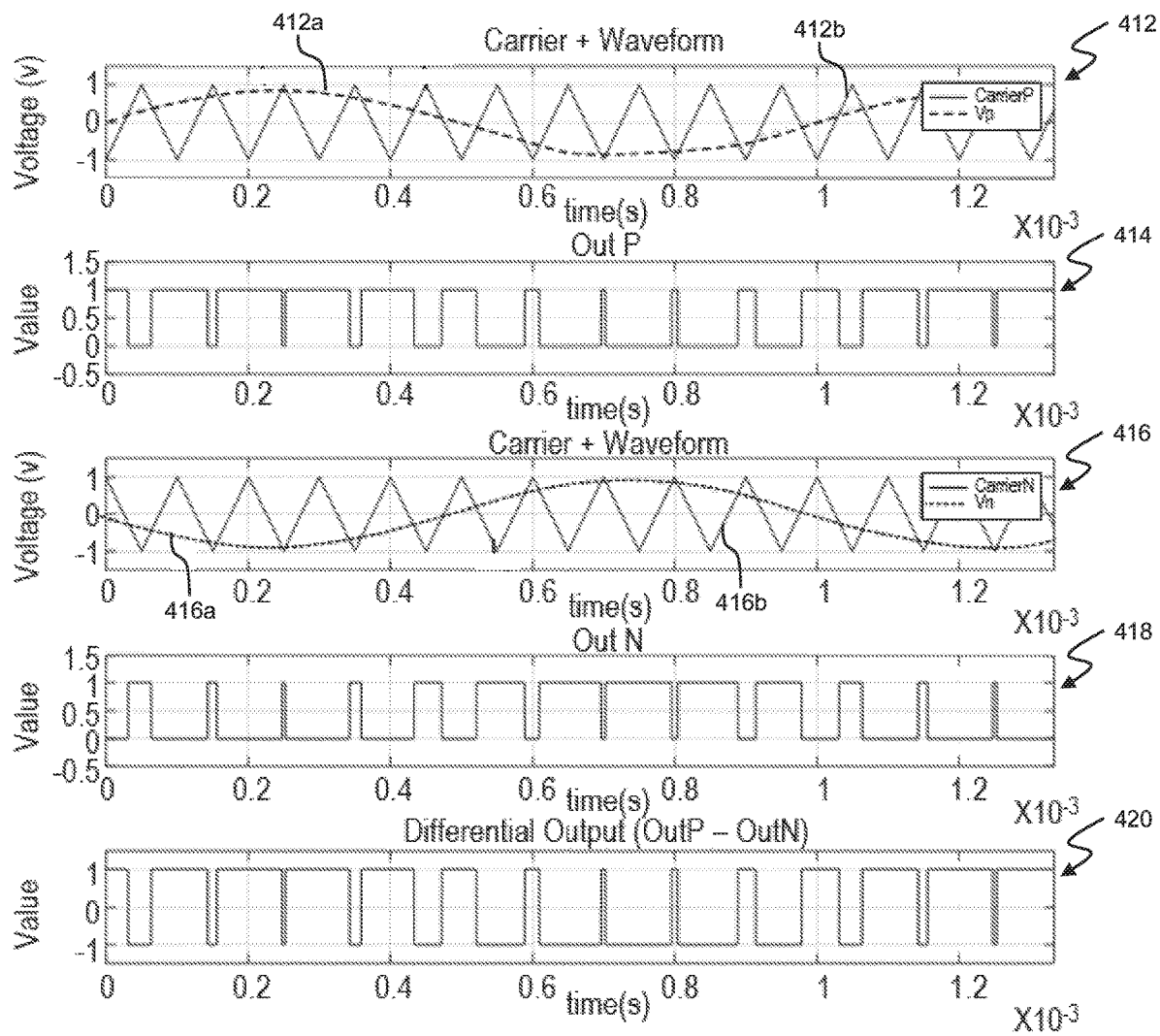
Figure 4C:
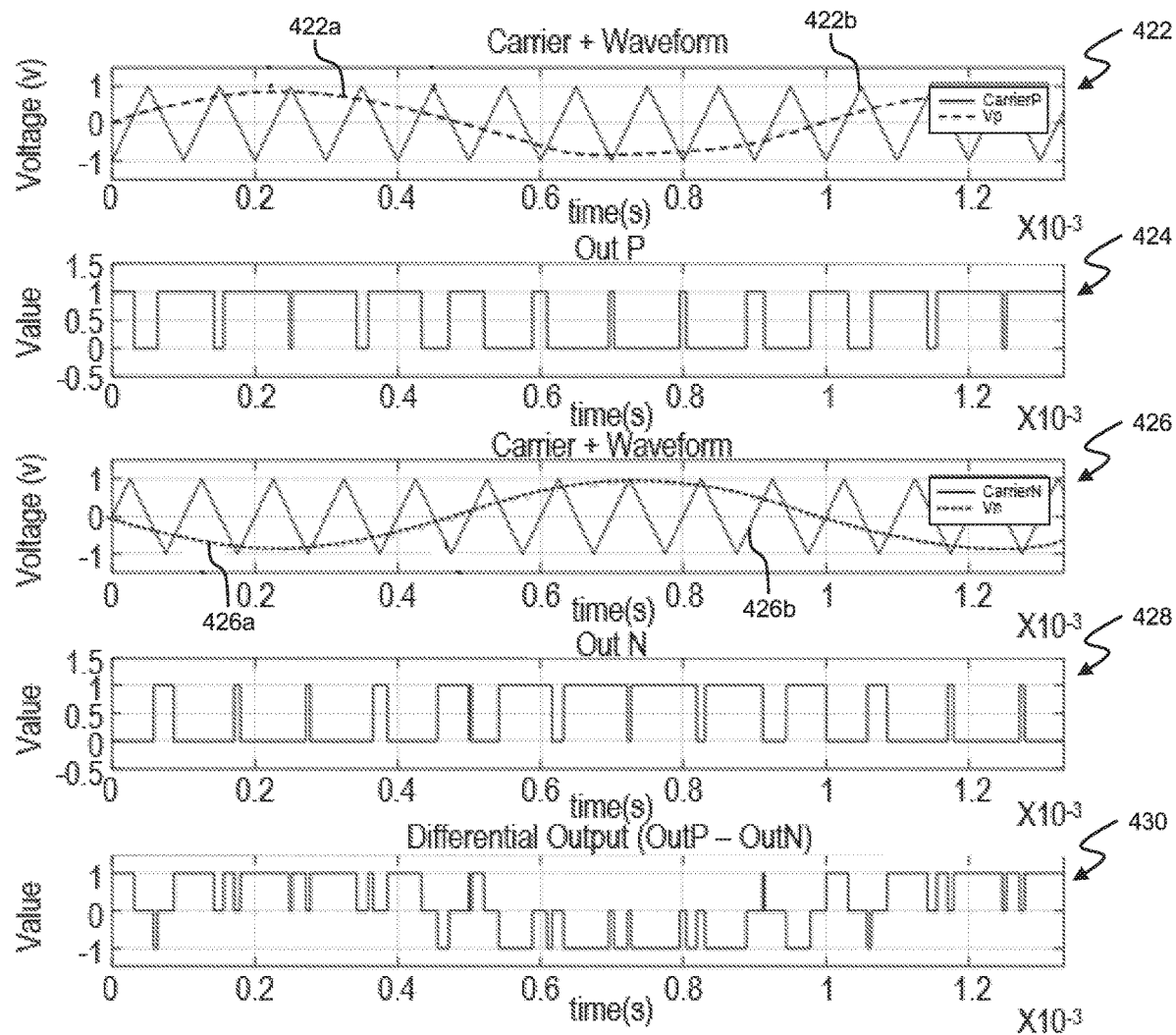

FIGS. 4a-4c show a series of waveforms illustrating the operation of the circuit implementation of FIG. 3b.

FIG. 4a shows the effect of applying no phase shift to the second carrier that is applied to the second comparator 304 of the circuit of FIG. 3b with respect to the first carrier that is applied to the first comparator 302.

The topmost waveform 402 of FIG. 4a shows a first input signal 402a of a differential input signal pair, which is input to the non-inverting input of the first comparator 302, and a triangle wave carrier 402b that is input to the inverting input of the first comparator 302 in the circuit 300 of FIG. 3b. The second waveform from the top 404 shows the resultant voltage at the node 324 of the first output portion 312. In this embodiment the positive supply rail is 1V and the negative supply rail is 0V, so this waveform switches between 1V and 0V.

The third waveform from the top 406 shows a second input signal 406a of the differential input signal pair, which is input to the non-inverting input of the second comparator 304, and a triangle wave carrier 406b that is input to the inverting input of the second comparator 304. It will be noted that in this waveform the triangle wave carrier is the same as the triangle wave carrier of the topmost waveform, i.e. the triangle wave carrier input to the second comparator 304 has not been phase shifted with respect to the triangle wave carrier input to the first comparator 302. The fourth waveform from the top 408 shows the resultant voltage at the node 332 of the second output portion 314.

The bottom waveform 410 in FIG. 4a shows the differential output across the load 316. As can be seen, the differential output has three levels (+1V, −1V, 0V). Thus, when no phase shift is applied to the triangle wave carrier input to the second comparator 304 with respect to the triangle wave carrier input to the first comparator 302, the circuit 300 operates in Class BD mode.

FIG. 4b shows the effect of applying a phase shift of 180 degrees to the carrier input to the second comparator 304 of the circuit of FIG. 3b. This is equivalent to inverting the carrier applied to the first comparator 302 and applying the inverted version of the carrier to the second comparator 304.

The topmost waveform 412 of FIG. 4b shows a first input signal 412a of a differential input signal pair, which is input to the non-inverting input of the first comparator 302, and a triangle wave carrier 412b that is input to the inverting input of the first comparator 302 in the circuit 300 of FIG. 3b. The second waveform from the top 414 shows the resultant voltage at the node 324 of the first output portion 312.

The third waveform from the top 416 shows a second input signal 416a of the differential input signal pair, which is input to the non-inverting input of the second comparator 304, and a triangle wave carrier 416b that is input to the inverting input of the second comparator 304. It will be noted that in this waveform the triangle wave carrier is the inverse of the triangle wave carrier of the topmost waveform, i.e. the triangle wave carrier input to the second comparator 304 has been phase shifted by 180 degrees with respect to the triangle wave carrier input to the first comparator 302. The fourth waveform from the top 418 shows the resultant voltage at the node 332 of the second output portion 314.

The bottom waveform 420 in FIG. 4b shows the differential output across the load 316. As can be seen, the differential output has only two levels (+1V, −1V). Thus, when a phase shift of 180 degrees is applied to the triangle wave carrier input to the second comparator 304 with respect to the triangle wave carrier input to the first comparator 302 (equivalent to inverting the carrier signal), the circuit 300 operates in Class AD mode.

FIG. 4c shows the effect of applying a phase shift of 90 degrees to the carrier signal input to the second comparator 304 of the circuit of FIG. 3b.

The topmost waveform 422 of FIG. 4c shows a first input signal 422a of a differential input signal pair, which is input to the non-inverting input of the first comparator 302, and a triangle wave carrier 422b that is input to the inverting input of the first comparator 302 in the circuit 300 of FIG. 3b. The second waveform from the top 424 shows the resultant voltage at the node 324 of the first output portion 312.

The third waveform from the top 426 shows a second input signal 426a of the differential input signal pair, which is input to the non-inverting input of the second comparator 304, and a triangle wave carrier 426b that is input to the inverting input of the second comparator 304. It will be noted that in this waveform the triangle wave carrier is phase shifted by 90 degrees with respect to the triangle wave carrier input to the first comparator 302. The fourth waveform from the top 428 shows the resultant voltage at the node 332 of the second output portion 314.

The bottom waveform 430 in FIG. 4c shows the differential output across the load 316. As can be seen, the differential output has three levels (+1V, −1V, 0). Thus, when a phase shift of 90 degrees is applied to the triangle wave carrier input to the second comparator 304 with respect to the triangle wave carrier input to the first comparator 302 the circuit 300 operates in Class BD mode. However, a comparison of the bottom waveform 430 of FIG. 4c with the bottom waveform 410 of FIG. 4a shows that in FIG. 4c there are fewer instances of the 0V state in the output waveform than in FIG. 4a and that the duration of the output pulses at the +1V and −1V states is in general longer than the duration of the output pulses at the +1V and −1V states in the waveform of FIG. 4a. This demonstrates how varying the phase shift applied to the second carrier that is input to the second comparator 304 can be used to tune the operating mode of the circuit 300 to accommodate different characteristics of input signals. For example, the phase shift applied in FIG. 4c may be suitable for use when the input signal level is large for a majority of the time, but has periods of lower signal level. Also, the phase shift applied in FIG. 4c may be suitable for use to allow a Class D amplifier to be designed to operate in a mode or modes to deliver a desired trade-off between say linearity and EMI, so that say a specified linearity may be obtained with the best possible EMI performance under that linearity constraint, or vice versa.

Note that for signals near zero, for Class BD operation the differential output is predominantly at zero, i.e. the two driver stages are operating in phase with each other. For Class AD operation, the differential output alternates between +1V and −1Vd, i.e. the two driver stages are operating in anti-phase with each other. For an intermediate mode of operation mid-way between the extremes the two driver stages may operate in-phase for half the time and in anti-phase the other half of the time. The percentage of time of in-phase versus anti-phase operation may be used as a measure of how far a given mode is from Class AD or Class BD. (If the signal monitor 210 is controlling the mode, normally in many implementations a constant or long duration zero input signal would result in Class BD operation, however the mode control may be on the basis of a signal envelope, so a signal of high peak-to-peak amplitude may have signals near zero at some regions in time, allowing some measurement of how far a present mode is from Class AD or Class BD.)

The circuit of FIG. 3b illustrates the invention and may offer adequate performance for some applications, for instance driving haptic or other mechanical transducers. However high-performance Class D amplifiers usually incorporate some feedback from the output, rather than operate open-loop.

Figure 5:
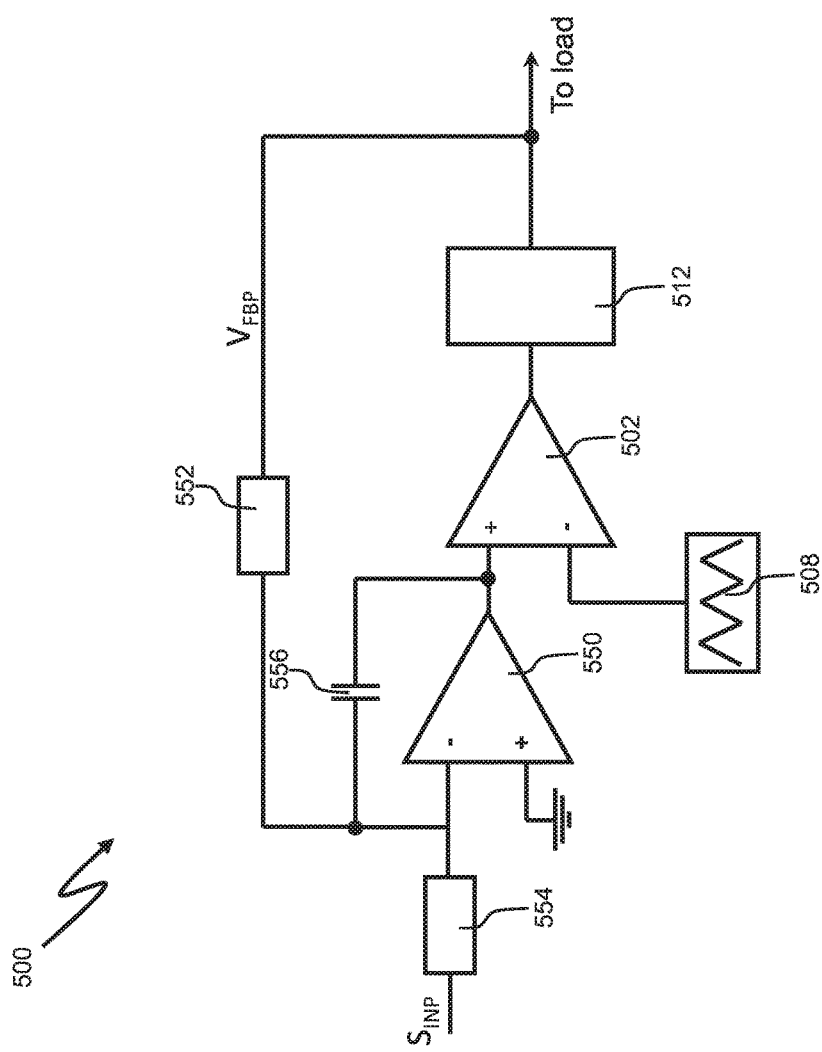
FIG. 5 is a schematic representation of an alternative circuit implementation of a half-circuit of the implementation of FIG. 3b.

FIG. 5 is a schematic representation of how feedback may be applied around the comparator and driver portion of a half-circuit of a Class D amplifier. The half-circuit, shown generally as 500 in FIG. 5, comprises a comparator 502, similar to comparator 302 of FIG. 3b, whose inverting input (−) is connected to an output of a carrier wave generator 508, similar to carrier wave generator 308 of FIG. 3b, which in this example is configured to generate a triangle wave carrier. An output of the comparator 502 drives driver stage 512, similar to driver stage 312 of FIG. 3b. The output of driver stage 512 may be connected to drive one terminal of a load (not illustrated), but is also connected to provide feedback of an output voltage $V_{FBP}$ via a feedback resistor 552.

The other terminal of resistor 552 is connected to an inverting input terminal of an amplifier 550 which serves to establish a virtual earth at this inverting input terminal. The virtual earth also receives, via an input resistance 554, an input analogue signal $S_{INP}$. The resulting signal currents through input resistor 554 and feedback resistor 552 are proportional to the input signal $S_{INP}$ and fed-back output signal $V_{FBP}$ respectively, scaled by the respective resistor values. The net signal current is integrated on feedback capacitor 556 to provide a signal representing the integral of the error between the input signal $S_{INP}$ and the fed-back output signal $V_{FBP}$. This integrated error signal, indicative of a difference between a signal output by the first driver stage and a first signal derived from the input signal, is input to the other, non-inverting (+), input of the comparator 502.

Thus a negative feedback loop is established comprising op-amp 550 and capacitor 556, in conjunction with resistors 552 and 554, operating as a loop filter. The loop filter output is connected to an input of comparator 502 which then controls output driver stage 512 to complete the loop. The loop filter provides high loop gain at low frequencies, but low gain at higher frequencies to avoid loop oscillation or other instability.

To provide a complete Class D amplifier, a similar half circuit is provided to drive the other terminal of the load and may receive the inverted input signal, to replace comparator 304 and driver stage 314 of FIG. 3b. Rather than receiving the same carrier wave from carrier wave generator 508, the second half circuit may receive a carrier wave from a carrier wave generator similar to carrier wave generator 310 of FIG. 3b, and thus the complete circuit may be controlled to operate in Class AD mode or Class BD mode, as described generally with respect to FIG. 3b.

As will be appreciated by those skilled in the art, due to the negative feedback, an amplifier comprising the half-circuits of FIG. 5 may provide improved performance, e.g. in terms of output signal distortion over the open-loop circuit 300 of FIG. 3b.

Figure 6:
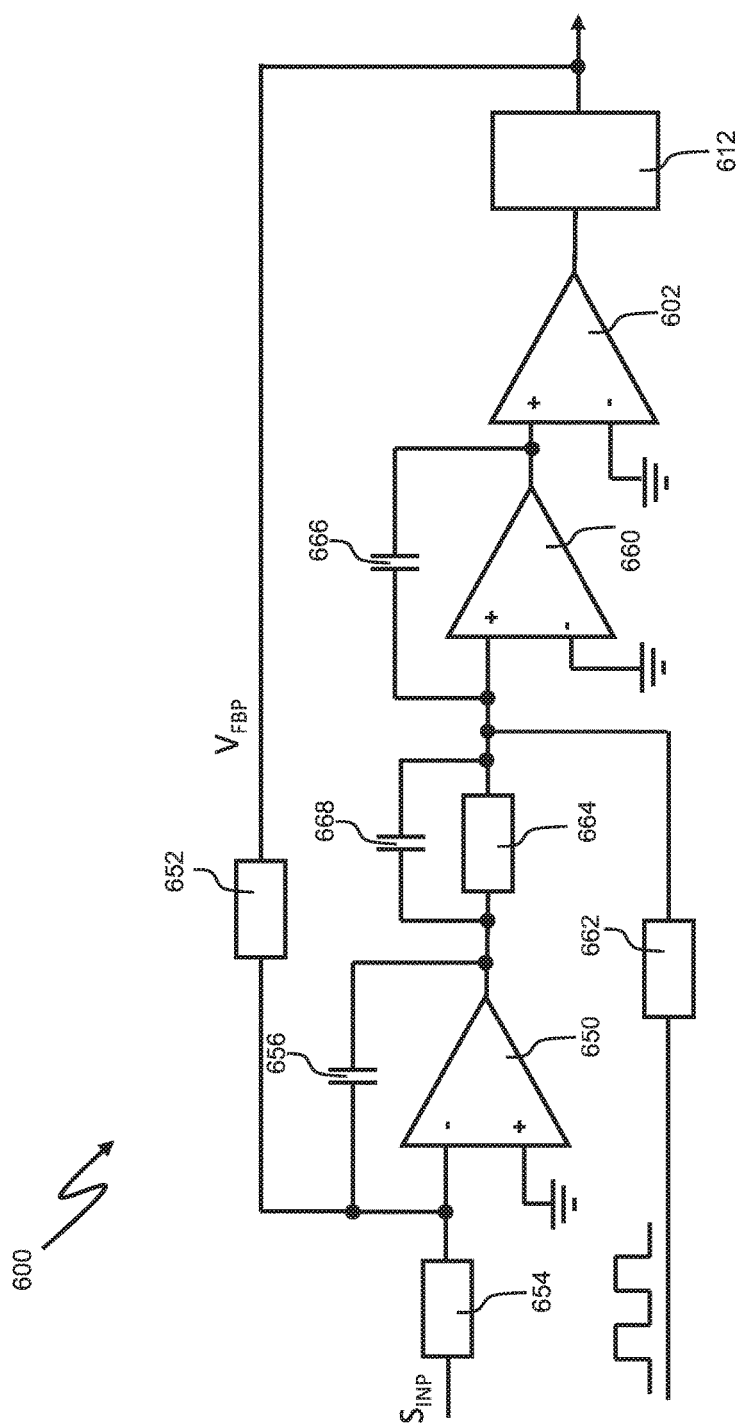
FIG. 6 is a schematic representation of a further alternative circuit implementation of a half-circuit of the implementation of FIG. 3b.

FIG. 6 is a schematic representation of an alternative implementation of a half-circuit for use in the circuit 300 of FIG. 3b, in which, instead of generating a triangle wave, which can be difficult to provide with adequate linearity for some applications, a square wave is injected into an integrator to indirectly provide a triangle wave carrier.

This alternative half-circuit, shown generally as 600, comprises an op-amp 650, a comparator 602, output driver stage 612, feedback resistor 652, input resistor 654 and integrator feedback capacitor 656 similar to respective similarly numbered elements 502, 512, 550, 552, 554, 556 of FIG. 5.

The output of op-amp 650 however does not drive the comparator directly. Instead its output is coupled to the comparator via a further loop filter stage comprising second stage input resistor 664, second op amp 660, and second integrating capacitor 666. Capacitor 668 may also be present, connected in parallel with resistor 664, to allow tailoring of the loop filter response for stability reasons.

Also in this example, there is no carrier wave received and applied separately to a comparator input. Instead, a square wave input current waveform is injected into the virtual earth current-summing node at the inverting input of the second op amp 660. This current may be supplied by an active current source or sources connected to this virtual earth node, or as shown may be provided by applying a square wave voltage to a resistor 662 connected to the virtual earth node.

The square-wave current signal injected into the virtual earth node is integrated by capacitor 666 to provide a triangular wave component of voltage at the output of op amp 660: this signal component is combined with a loop filter signal component derived from the output of op amp 650 via resistor 664 (and capacitor 668) and integrated by capacitor 666, and the net signal is applied to an input of comparator 602, whose other input is a signal earth. Thus the loop filter signal component, indicative of a difference between a signal output by the driver stage and a signal derived from the input signal is effectively compared against a triangle carrier wave component.

To provide a complete Class D amplifier, a similar half circuit is provided to drive the other terminal of the load and to receive the inverted input signal, to replace comparator 304 and driver stage 314 of FIG. 3b. Rather than receiving the same square wave as the first half-circuit, the second half circuit may receive a square wave from a carrier wave generator similar to carrier wave generator 310 of FIG. 3b, and according to the delay between the square waves used in the two half-circuits the complete circuit may be controlled to operate in two or more of Class AD or Class BD or intermediate "Class ADBD" modes, as described generally with respect to FIG. 3b.

Thus, the half-circuit 600 of FIG. 6 obviates the need for complex circuitry to provide a triangle wave carrier with necessary linearity. Also delaying a square wave, by say a number of cycles of a higher speed clock, may easily be performed purely digitally. Also the loop filter is second-order, allowing higher loop gain at low frequencies and flexibility in designing the loop response.

As will be appreciated by those skilled in the art, the system described herein provide a mechanism for switching dynamically between two or more Class AD or Class BD or Class ADBD operating modes in a Class D amplifier. This allows the most appropriate operating mode to be selected depending upon the properties or characteristics of the input signal thus enabling the benefits of each operating mode to be realised in a single amplifier.

Embodiments may be implemented in a range of applications and in particular are suitable for audio applications. For example, the Class D amplifier circuitry described above may be used to drive an audio transducer such as a loudspeaker, headphone, earphone or earbud. However, it will be appreciated that the class D amplifier circuitry described above may equally be used in applications other than audio, for example as a haptic output driver to drive a haptic transducer such as a linear resonant actuator, or more generally as a mechanical transducer driver to drive a mechanical transducer.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a wearable device such as a smartwatch. The device could be a device with voice control or activation functionality. In some instances the device could be an accessory device such as a headset or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. Class D amplifier circuitry comprising:
   first and second half-bridge output stages; and
   a mode controller configured to dynamically adjust the relative phase of cyclic references applied to respective switching controllers of the first and second half-bridge output stages so as to dynamically adjust an operational switching mode of the Class D amplifier over a range between a Class AD mode and a Class BD mode.

2. Class D amplifier circuitry according to claim 1 wherein:
   in a first operational switching mode a relative phase difference between the cyclic references is substantially 180 degrees.

3. Class D amplifier circuitry according to claim 1 wherein:
   in a second operating mode a relative phase difference between the cyclic references is substantially zero.

4. Class D amplifier circuitry according to claim 1 wherein:
   in a third operating mode a relative phase difference between the cyclic references is a non-zero value other than 180 degrees.

5. Class D amplifier circuitry according to claim 1 wherein the mode controller is configured to dynamically adjust the relative phase of the cyclic references between a non-zero value and zero over a predetermined period of time in order to transition from a first operating mode or a third operating mode to a second operating mode and to adjust the relative phase of the cyclic references between zero and a non-zero value over a predetermined period of time in order to transition from the second operating mode to the first or third operating mode.

6. Class D amplifier circuitry according to claim 1 wherein the mode controller is configured to dynamically adjust the relative phase of the cyclic references based on an indication, parameter, characteristic or feature of an input signal received at an input of the class D amplifier circuitry.

7. Class D amplifier circuitry according to claim 6, wherein the mode controller is configured to cause the Class D amplifier circuitry to transition from a first operating mode to a second operating mode if the indication, parameter, characteristic or feature of the input signal meets or falls below a first threshold and to cause the Class D amplifier to transition from the second operating mode to the first operating mode if the indication, parameter, characteristic or feature of the input signal meets or exceeds a second threshold.

8. Class D amplifier circuitry according to claim 7 wherein the second threshold is different from the first threshold.

9. Class D amplifier circuitry according to claim 7 wherein the indication, parameter, characteristic or feature of the input signal comprises at least one of:
an instantaneous signal level of the input signal; and
an envelope of the input signal.

10. Class D amplifier circuitry according to claim 6 further comprising monitoring circuitry configured to generate a mode control signal for output to the mode controller based on an indication, parameter, characteristic or feature of the input signal.

11. Class D amplifier circuitry according to claim 10, wherein the monitoring circuitry is configured to monitor a parameter of the input signal and to generate a mode control signal to cause the Class D amplifier circuitry to transition from a first operating mode to a second operating mode if the monitored parameter of the input signal meets or falls below a first threshold and to generate a mode control signal to cause the Class D amplifier to transition from the second operating mode to the first operating mode if the monitored parameter of the input signal meets or exceeds a second threshold.

12. Class D amplifier circuitry according to claim 10 wherein the monitoring circuitry is configured to receive information about the input signal and to generate a mode control signal for output to the mode controller based on the received information, wherein the received information comprises at least one of:
a received indication of the signal level of the input signal;
a received indication of a forthcoming change in the signal level of the input signal;
a received indication of a load attached to the class D amplifier circuitry;
a received indication of a signal type of the input signal; and
a received indication that a period of silence has been detected in an input audio signal.

13. Class D amplifier circuitry according to claim 10 wherein the monitoring circuitry is configured to generate the mode control signal based on at least one of:
a signal level of an output signal of the Class D amplifier circuitry; and
an envelope of an output signal of the Class D amplifier circuitry.

14. Class D amplifier circuitry according to claim 1 wherein:
the first half-bridge output stage comprises a first driver stage for switching the first node between a first supply rail and a second supply rail; and
the second half-bridge output stage comprises a second driver stage for switching the second node between the first supply rail and the second supply.

15. Class D amplifier circuitry according to claim 14 further comprising:
first driver control circuitry configured to receive a first carrier wave and to control switching of the first driver stage based on the first carrier wave and a first input signal component of an input signal; and
second driver control circuitry configured to receive a second carrier wave and to control switching of the first driver stage based on the first carrier wave and a first input signal component of an input signal.

16. Class D amplifier circuitry according to claim 15 further comprising a carrier wave generator configured to receive a source carrier wave and to generate the first and second carrier waves.

17. Class D amplifier circuitry according to claim 15 wherein the first input signal component comprises a first input signal of a differential input signal pair, and the second input signal component comprises a second input signal of the differential input signal pair.

18. Class D amplifier circuitry according to claim 14 wherein:
the first driver control circuitry comprises first integrator circuitry configured to receive a first digital signal and to generate the first carrier wave based on the received first digital signal; and
the second driver control circuitry comprises second integrator circuitry configured to receive a second digital signal and to generate the second carrier wave based on the received second digital signal.

19. Class D amplifier circuitry according to claim 18 wherein the first digital signal and the second digital signal comprise respective first and second square wave current waveforms.

20. An electronic apparatus comprising Class D amplifier circuitry according to claim 1, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

* * * * *